United States Patent
Su et al.

(10) Patent No.: US 12,205,819 B2
(45) Date of Patent: Jan. 21, 2025

(54) METHOD AND DEVICE FOR FORMING METAL GATE ELECTRODES FOR TRANSISTORS

(71) Applicant: Taiwan Semiconductor Manufacturing Co., Ltd., Hsin-Chu (TW)

(72) Inventors: Huan-Chieh Su, Changhua County (TW); Zhi-Chang Lin, Hsinchu County (TW); Ting-Hung Hsu, Miaoli (TW); Jia-Ni Yu, New Taipei (TW); Wei-Hao Wu, Hsinchu (TW); Yu-Ming Lin, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/061,794

(22) Filed: Dec. 5, 2022

(65) Prior Publication Data

US 2023/0099320 A1 Mar. 30, 2023

Related U.S. Application Data

(60) Continuation of application No. 17/174,990, filed on Feb. 12, 2021, now Pat. No. 11,521,858, which is a
(Continued)

(51) Int. Cl.
*H01L 29/66* (2006.01)
*H01L 21/28* (2006.01)
(Continued)

(52) U.S. Cl.
CPC .... *H01L 21/28114* (2013.01); *H01L 21/3086* (2013.01); *H01L 21/823821* (2013.01);
(Continued)

(58) Field of Classification Search
CPC .......... H01L 21/28114; H01L 21/3086; H01L 21/823821; H01L 21/823828;
(Continued)

(56) References Cited

U.S. PATENT DOCUMENTS 5,966,597 A 10/1999 Wright
6,440,830 B1 8/2002 Lopatin
(Continued)

FOREIGN PATENT DOCUMENTS

CN 108269737 A 7/2018
JP 2000138357 A 5/2000
(Continued)

*Primary Examiner* — Eduardo A Rodela
(74) *Attorney, Agent, or Firm* — HAYNES AND BOONE, LLP

(57) ABSTRACT

A semiconductor device includes a first transistor and a second transistor. The first transistor includes: a first source and a first drain separated by a first distance, a first semiconductor structure disposed between the first source and first drain, a first gate electrode disposed over the first semiconductor structure, and a first dielectric structure disposed over the first gate electrode. The first dielectric structure has a lower portion and an upper portion disposed over the lower portion and wider than the lower portion. The second transistor includes: a second source and a second drain separated by a second distance greater than the first distance, a second semiconductor structure disposed between the second source and second drain, a second gate electrode disposed over the second semiconductor structure, and a second dielectric structure disposed over the second gate electrode. The second dielectric structure and the first dielectric structure have different material compositions.

20 Claims, 34 Drawing Sheets

Related U.S. Application Data division of application No. 16/370,258, filed on Mar. 29, 2019, now Pat. No. 10,930,763.

(60) Provisional application No. 62/736,087, filed on Sep. 25, 2018.

(51) Int. Cl.
    *H01L 21/308*     (2006.01)
    *H01L 21/8238*     (2006.01)
    *H01L 27/092*     (2006.01)
    *H01L 29/51*     (2006.01)
    *H01L 29/78*     (2006.01)

(52) U.S. Cl.
CPC ............... *H01L 21/823828* (2013.01); *H01L 21/823857* (2013.01); *H01L 27/0924* (2013.01); *H01L 29/517* (2013.01); *H01L 29/66553* (2013.01); *H01L 29/66795* (2013.01); *H01L 29/785* (2013.01)

(58) Field of Classification Search
CPC ......... H01L 21/823857; H01L 27/0924; H01L 29/517; H01L 29/66795; H01L 29/785; H01L 21/28247; H01L 21/76834; H01L 21/7685; H01L 21/76852; H01L 29/66553
See application file for complete search history.

(56) References Cited

U.S. PATENT DOCUMENTS

| | | | |
|---|---|---|---|
| 6,500,743 B1 | 12/2002 | Lopatin | |
| 9,876,094 B2 * | 1/2018 | Bae | H01L 21/76843 |
| 10,340,142 B1 | 7/2019 | Gao et al. | |
| 10,347,744 B1 * | 7/2019 | Cheng | H01L 21/02252 |
| 10,374,058 B2 * | 8/2019 | Su | H01L 27/0886 |
| 10,468,407 B2 * | 11/2019 | Chang | H01L 21/823481 |
| 10,529,826 B1 * | 1/2020 | Frougier | H01L 29/42372 |
| 10,566,430 B2 * | 2/2020 | Cheng | H01L 21/76831 |
| 10,804,161 B2 * | 10/2020 | Chiu | H01L 29/785 |
| 10,879,180 B2 * | 12/2020 | Zang | H01L 21/76897 |
| 10,930,763 B2 | 2/2021 | Su et al. | |
| 2003/0143791 A1 | 7/2003 | Cheong et al. | |
| 2007/0104862 A1 * | 5/2007 | Lai | H01L 21/28114 427/259 |
| 2008/0253170 A1 | 10/2008 | Inaba | |
| 2013/0181265 A1 * | 7/2013 | Grasshoff | H01L 21/76897 438/692 |
| 2014/0027764 A1 | 1/2014 | Yamazaki et al. | |
| 2014/0319620 A1 | 10/2014 | Hoentschel et al. | |
| 2015/0123175 A1 | 5/2015 | Lin et al. | |
| 2016/0056262 A1 | 2/2016 | Ho et al. | |
| 2017/0317079 A1 | 11/2017 | Kim et al. | |
| 2019/0006486 A1 | 1/2019 | Ching et al. | |
| 2019/0067120 A1 | 2/2019 | Ching et al. | |
| 2019/0088762 A1 | 3/2019 | Su et al. | |
| 2019/0165121 A1 * | 5/2019 | Park | H01L 29/42376 |
| 2019/0165127 A1 | 5/2019 | Ching et al. | |
| 2020/0044072 A1 | 2/2020 | Chiang et al. | |
| 2020/0058785 A1 | 2/2020 | Tsai et al. | |
| 2020/0098622 A1 | 3/2020 | Su et al. | |
| 2020/0098759 A1 | 3/2020 | Su et al. | |
| 2020/0119009 A1 | 4/2020 | Kim et al. | |

FOREIGN PATENT DOCUMENTS

| | | |
|---|---|---|
| JP | 2010050474 B2 | 3/2010 |
| JP | 2010056578 B2 | 3/2010 |
| JP | 2014042005 A | 3/2014 |
| KR | 20160098187 | 8/2016 |

\* cited by examiner

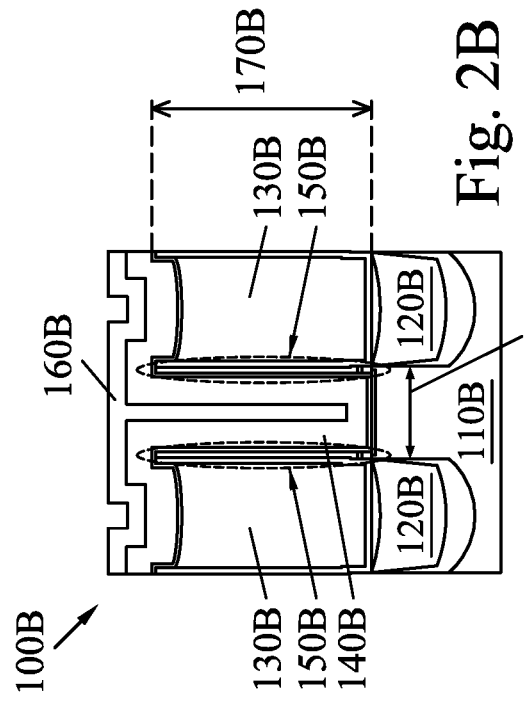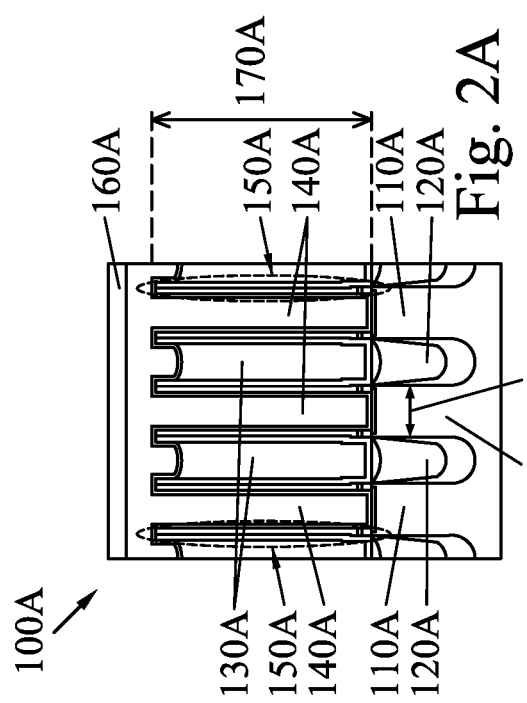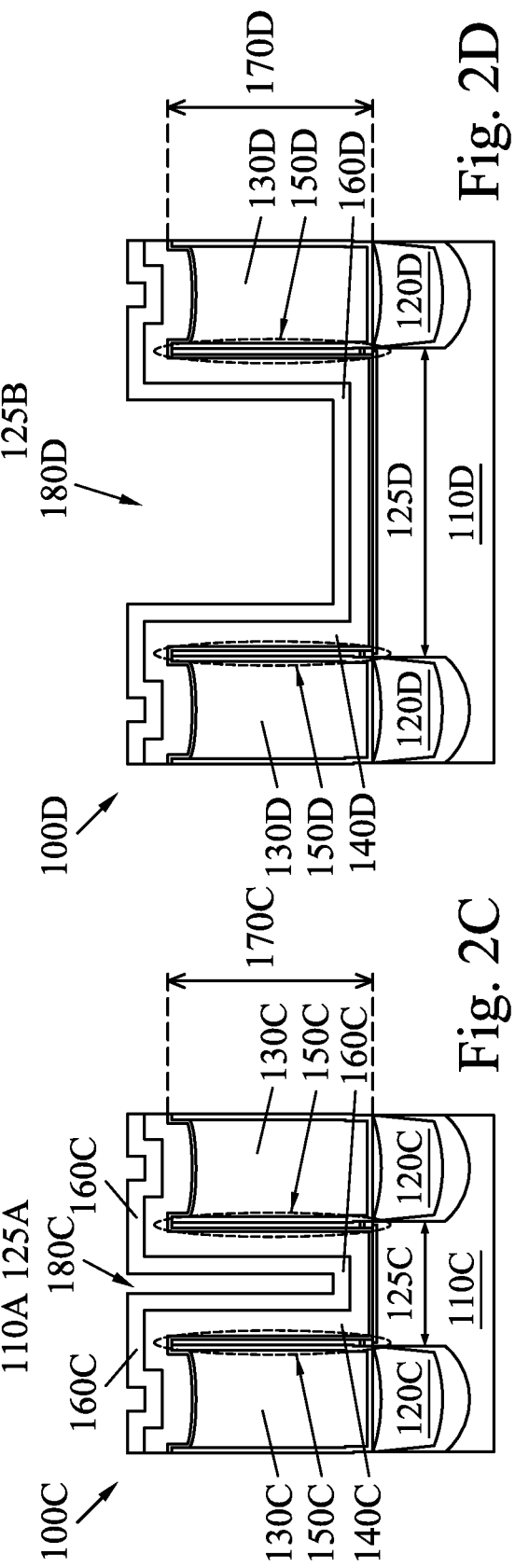

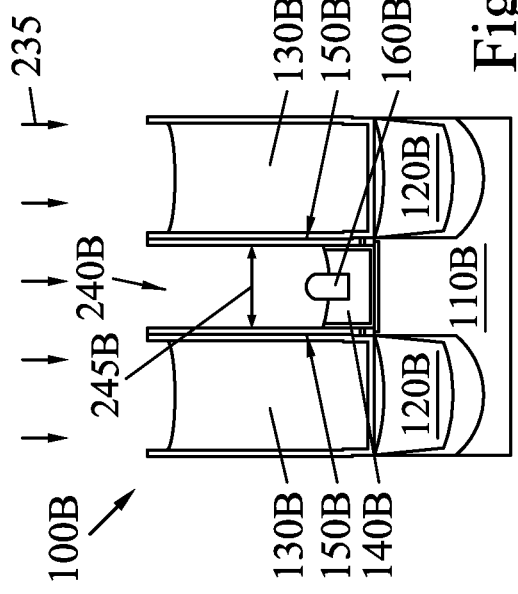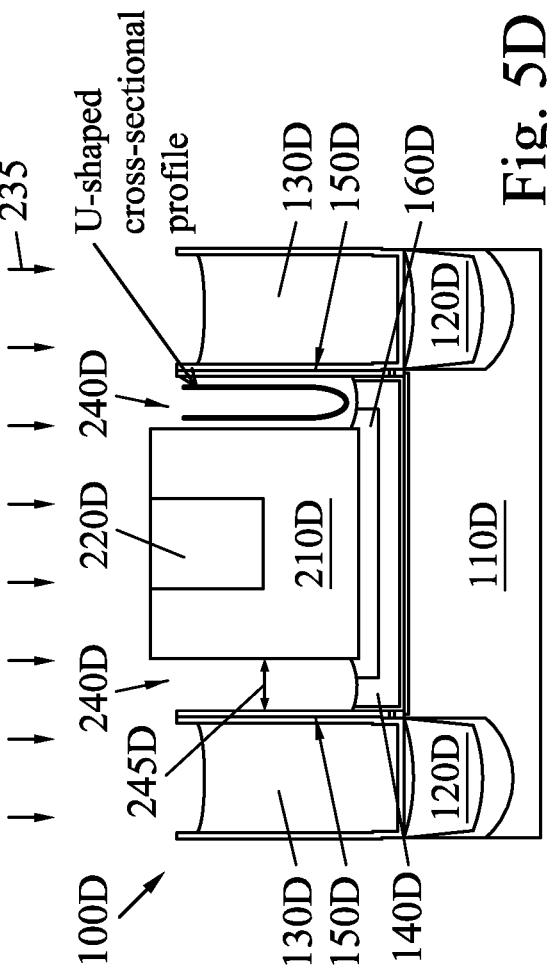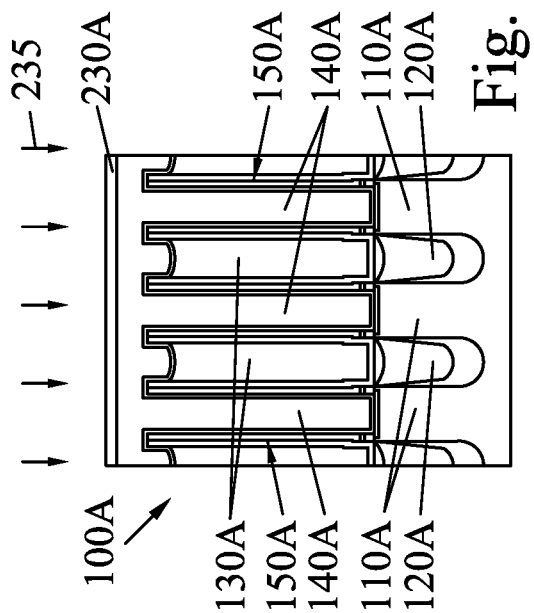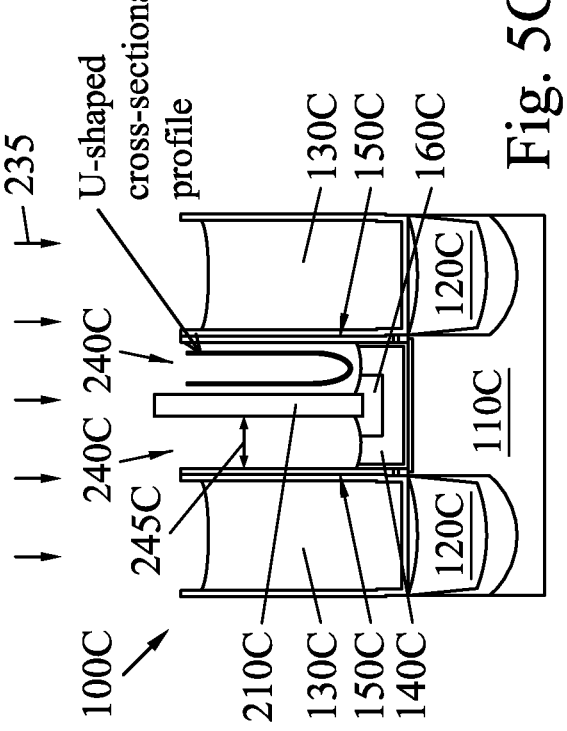

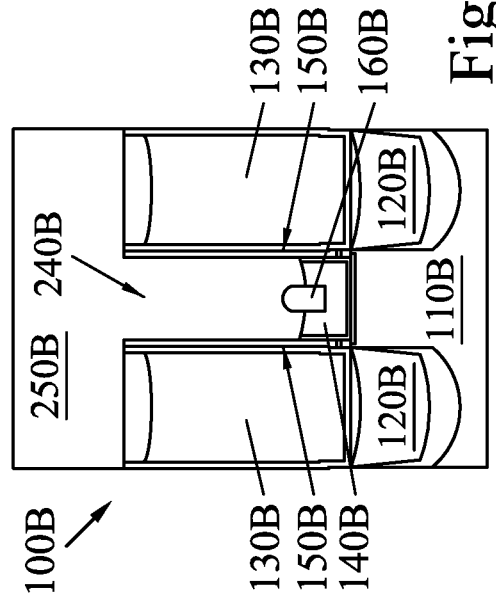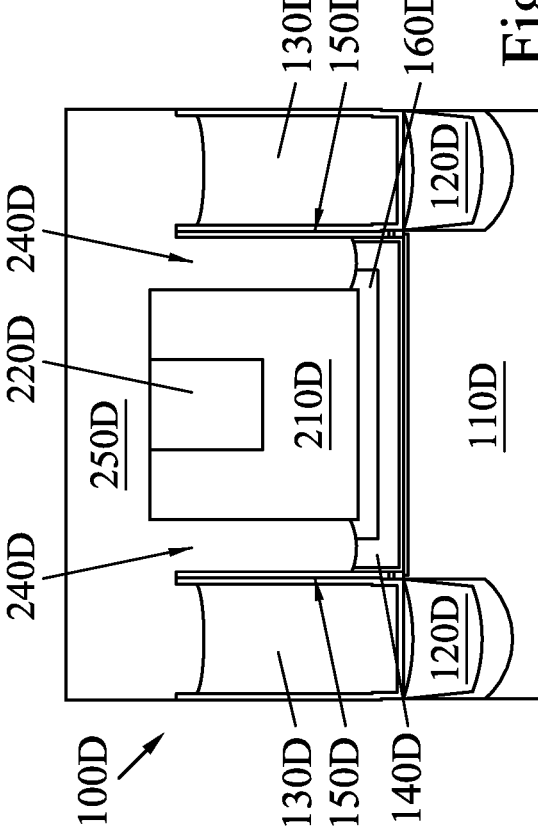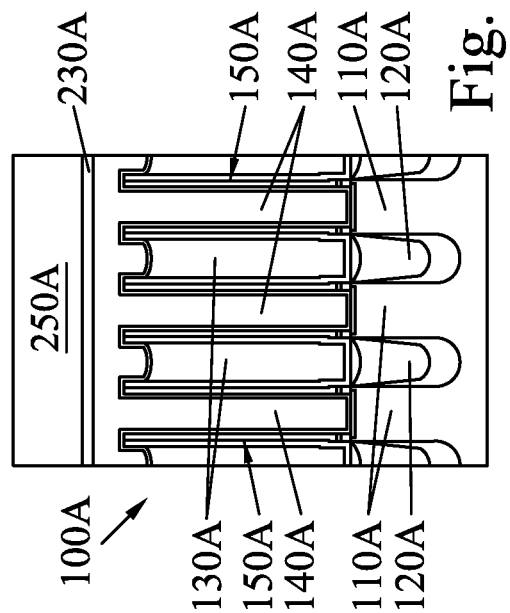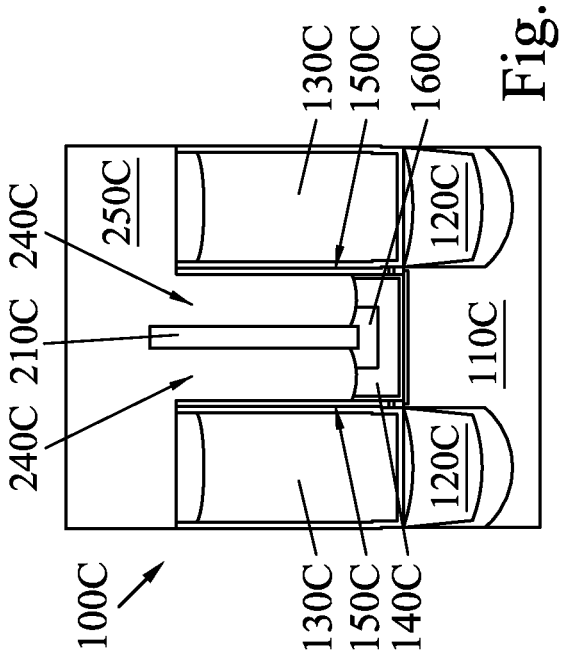
Fig. 6A
Fig. 6B
Fig. 6C
Fig. 6D

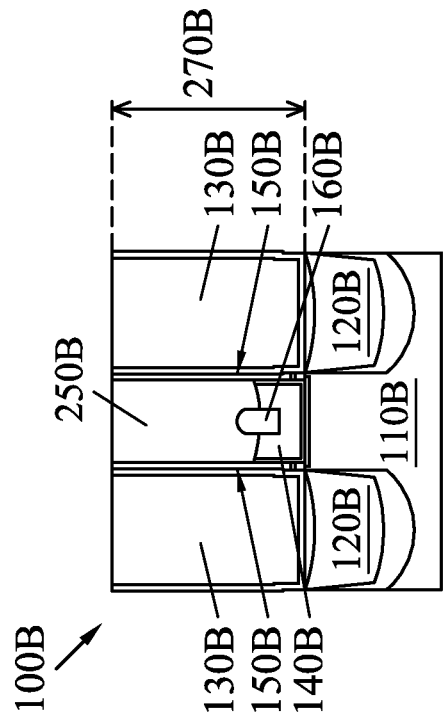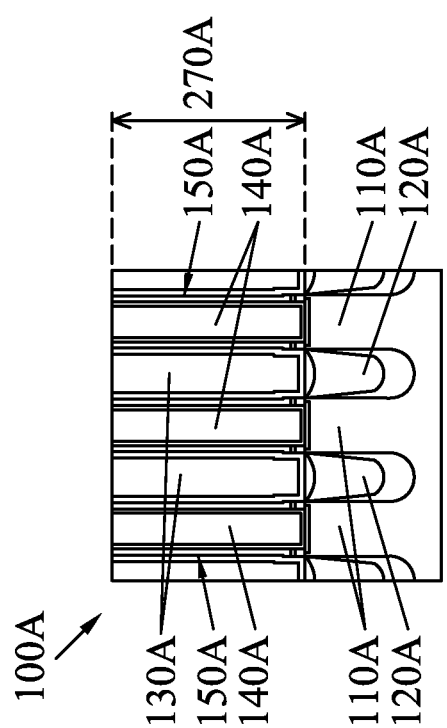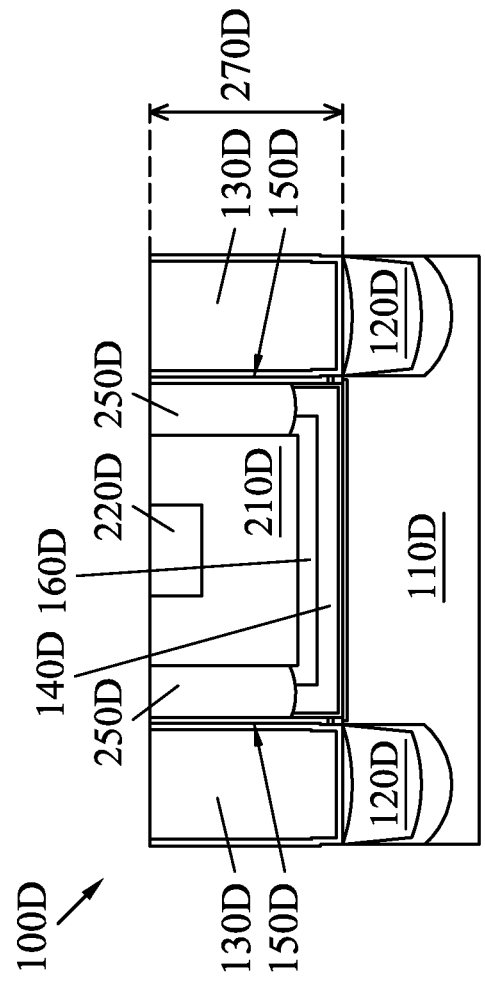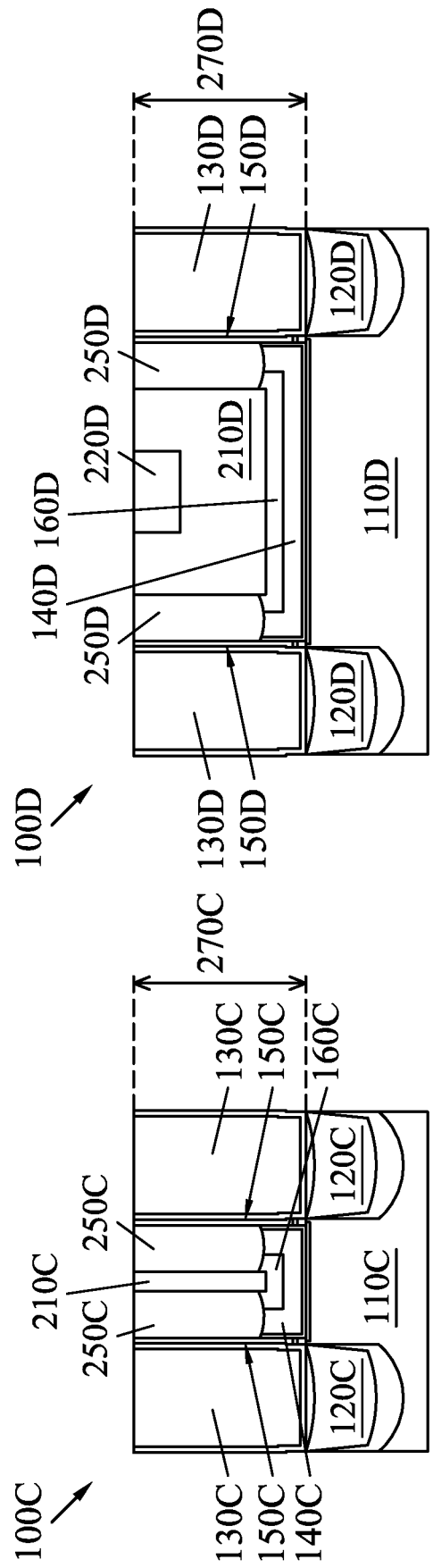

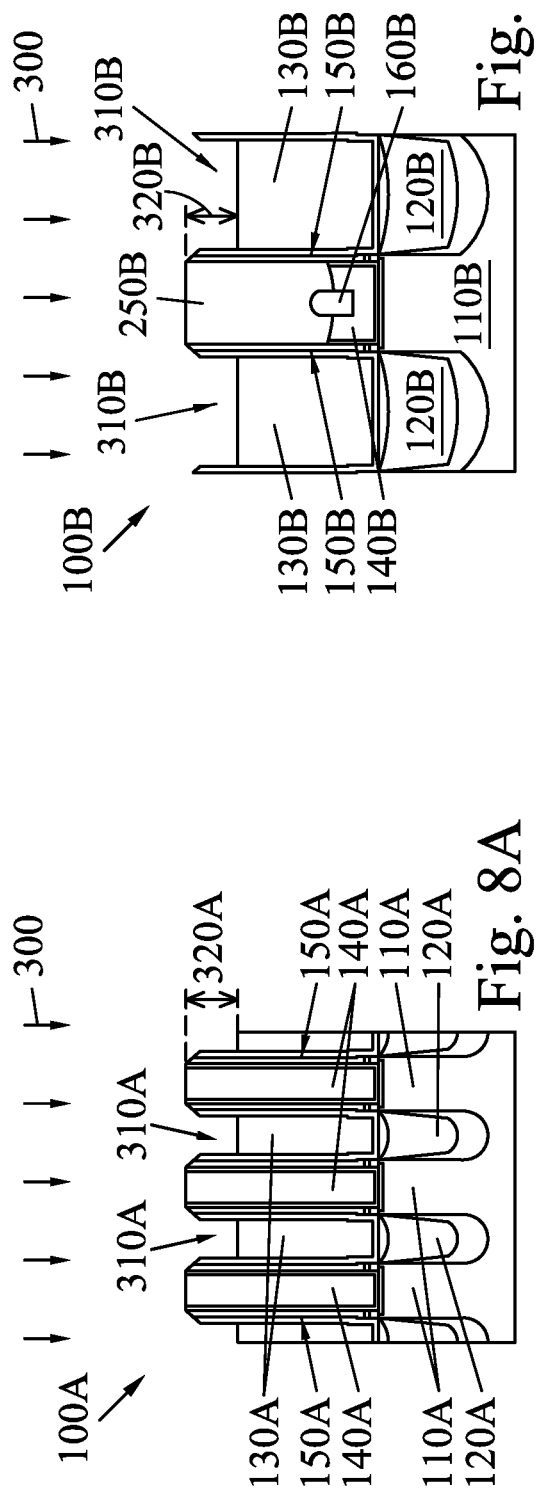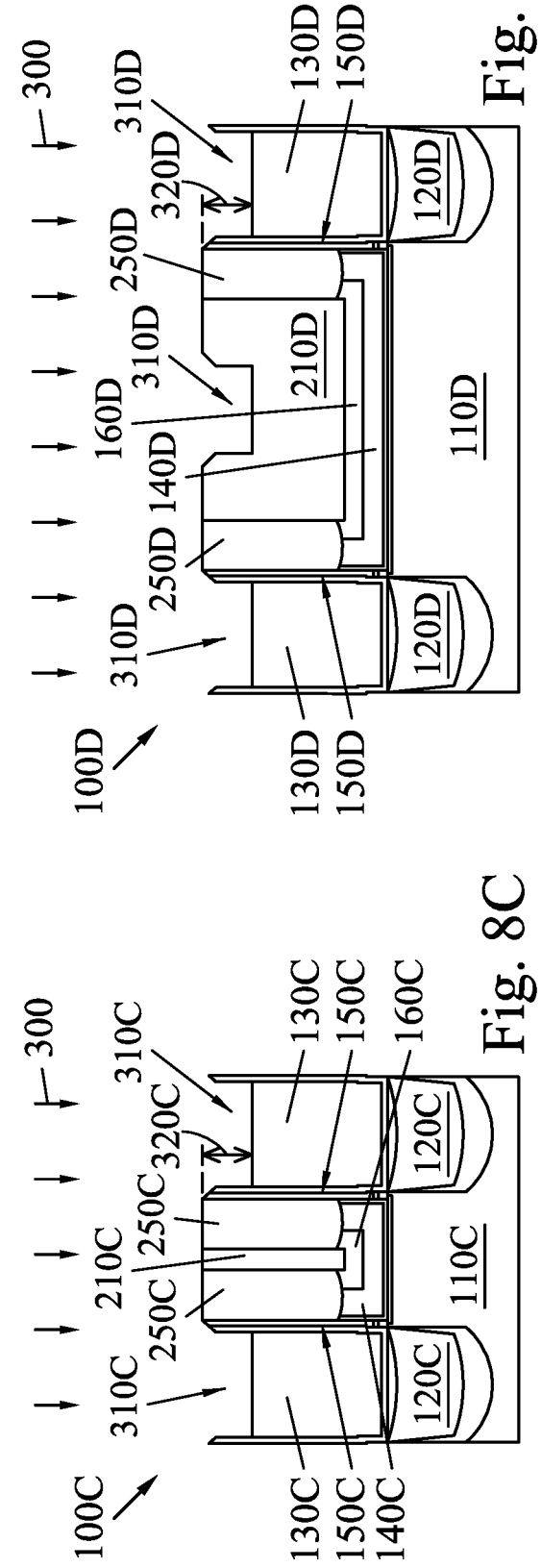

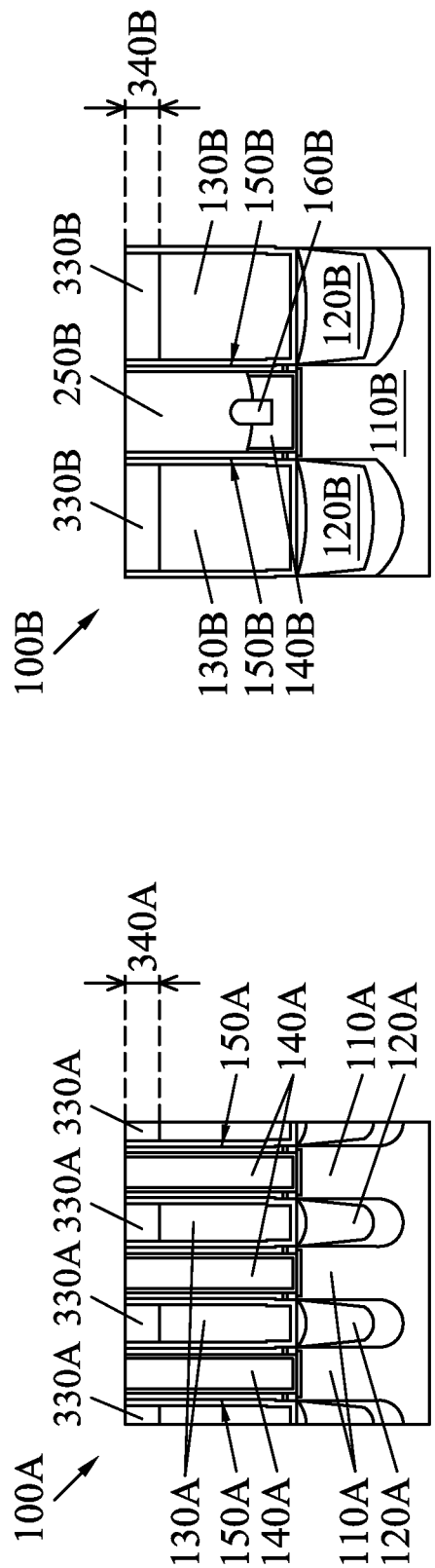
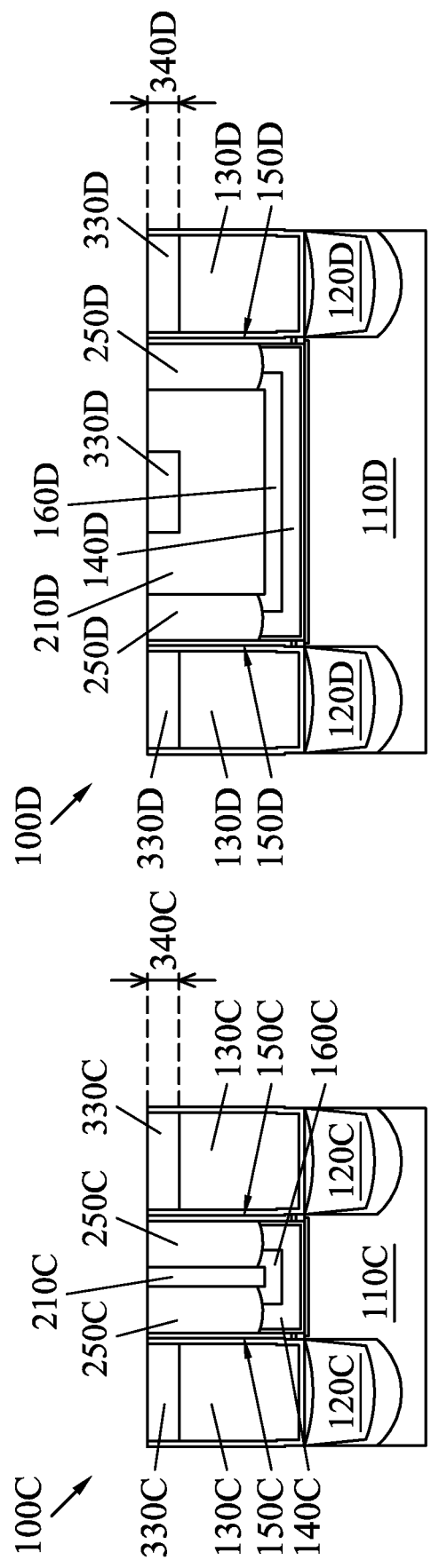
Fig. 9A  Fig. 9B  Fig. 9C  Fig. 9D

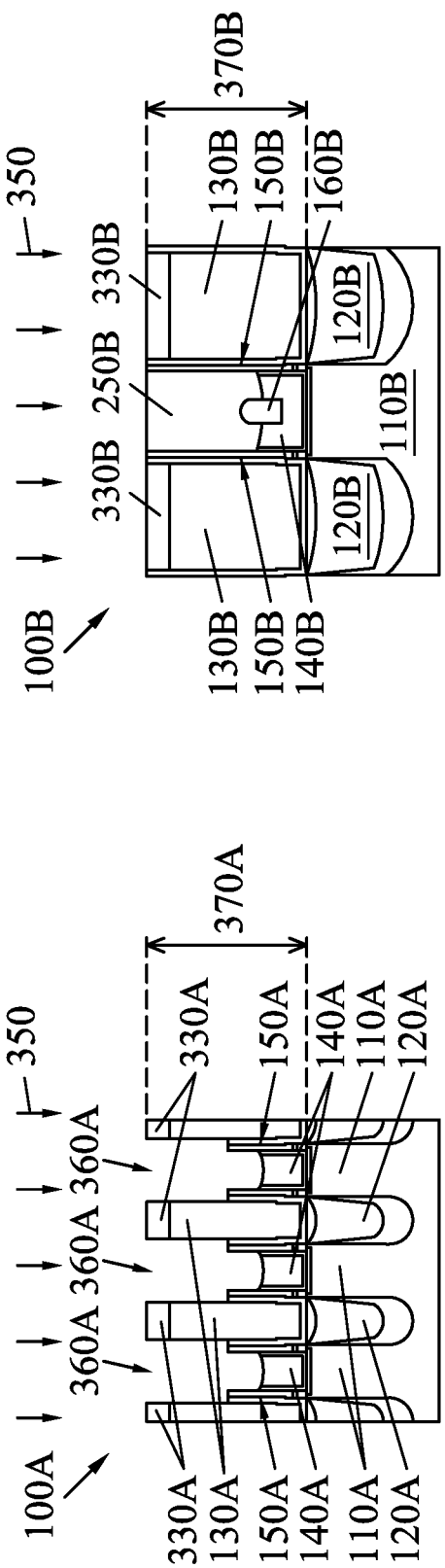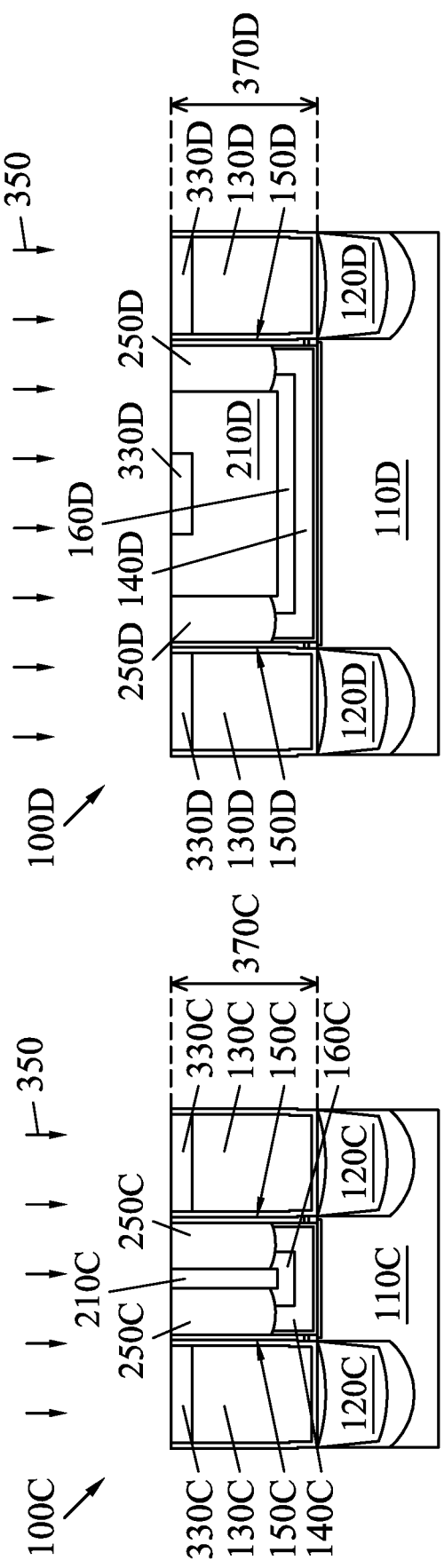
Fig. 10A
Fig. 10B
Fig. 10C
Fig. 10D

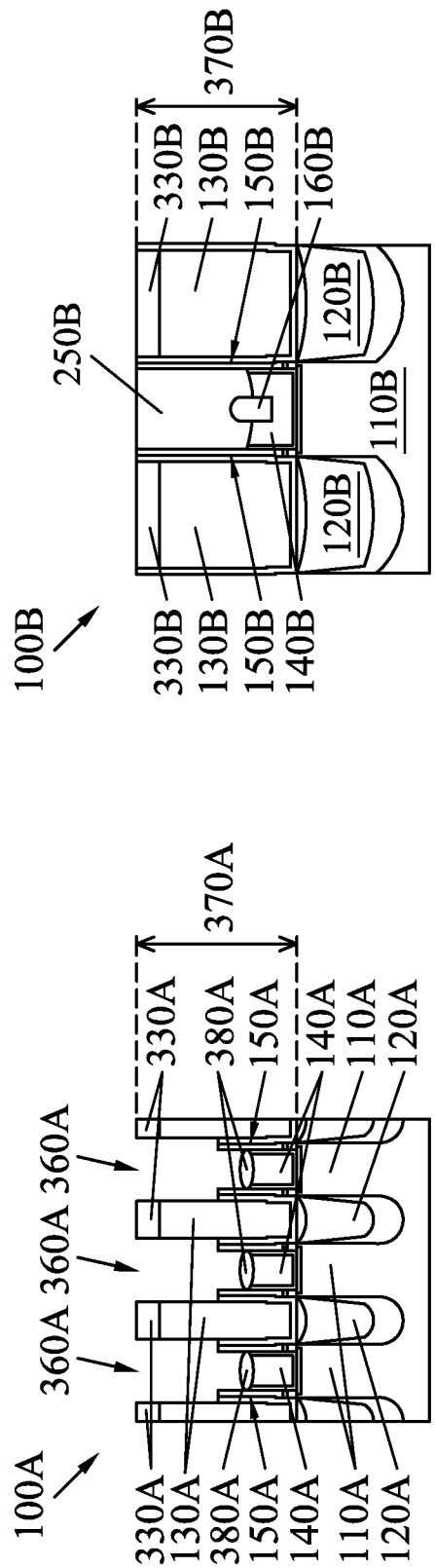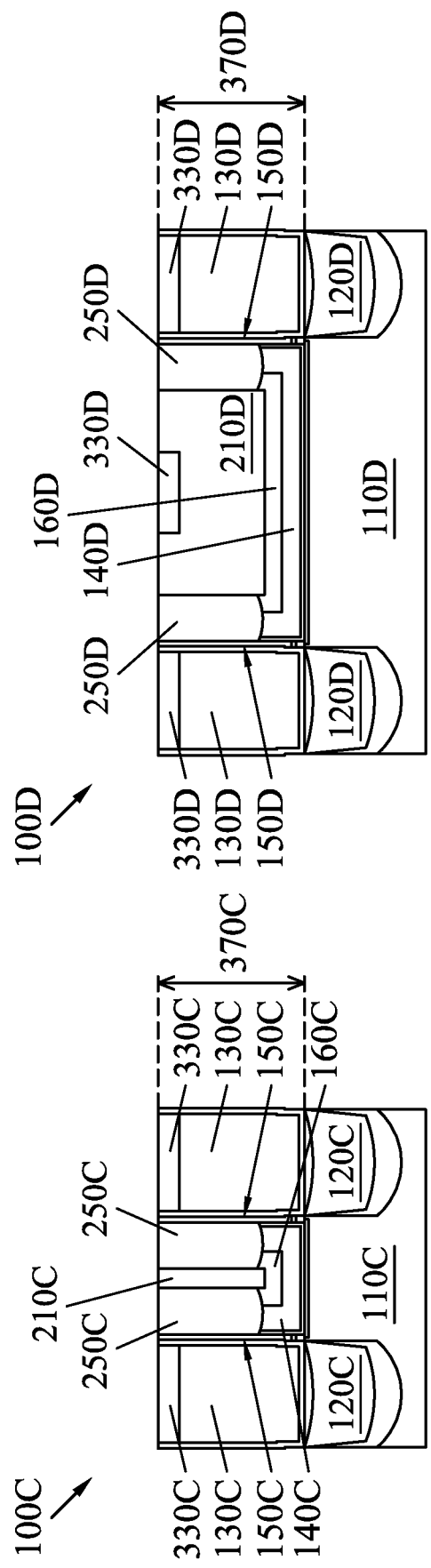
Fig. 11A
Fig. 11B
Fig. 11C
Fig. 11D

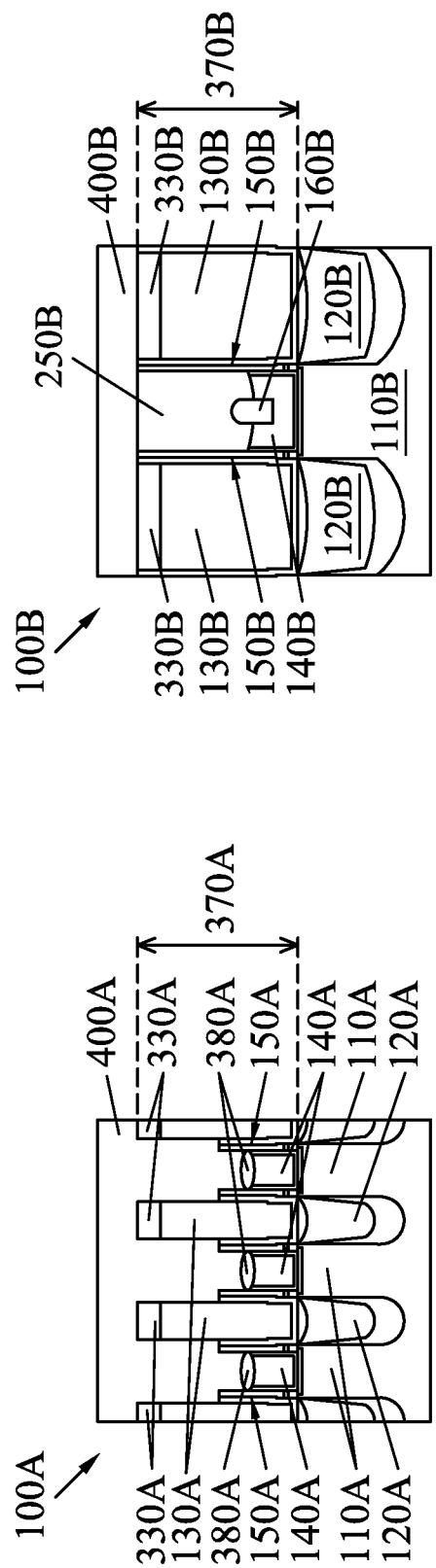
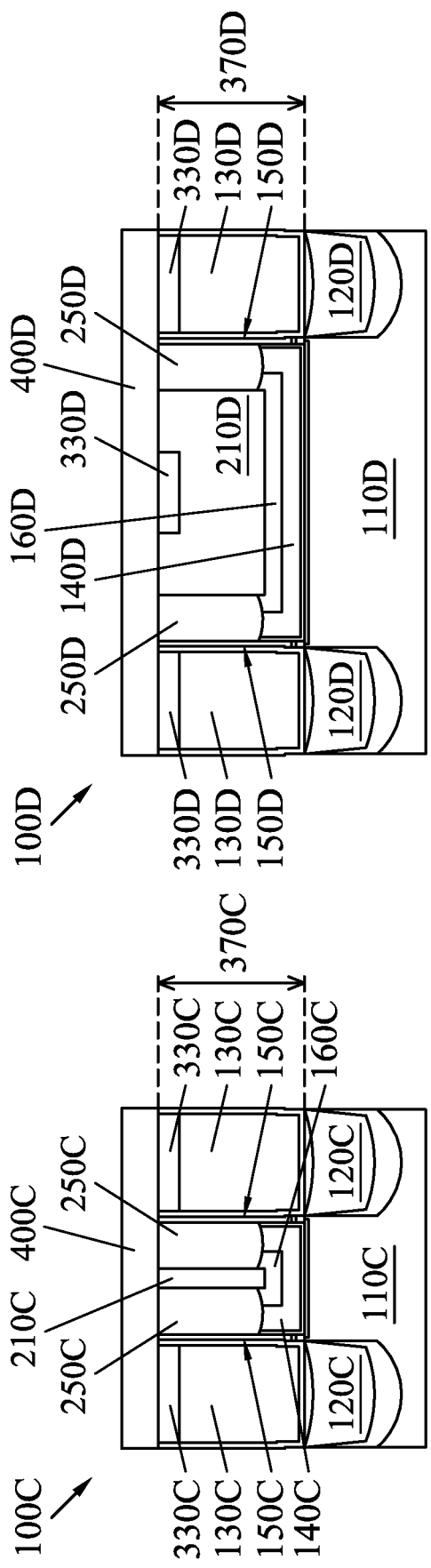
Fig. 12A
Fig. 12B
Fig. 12C
Fig. 12D

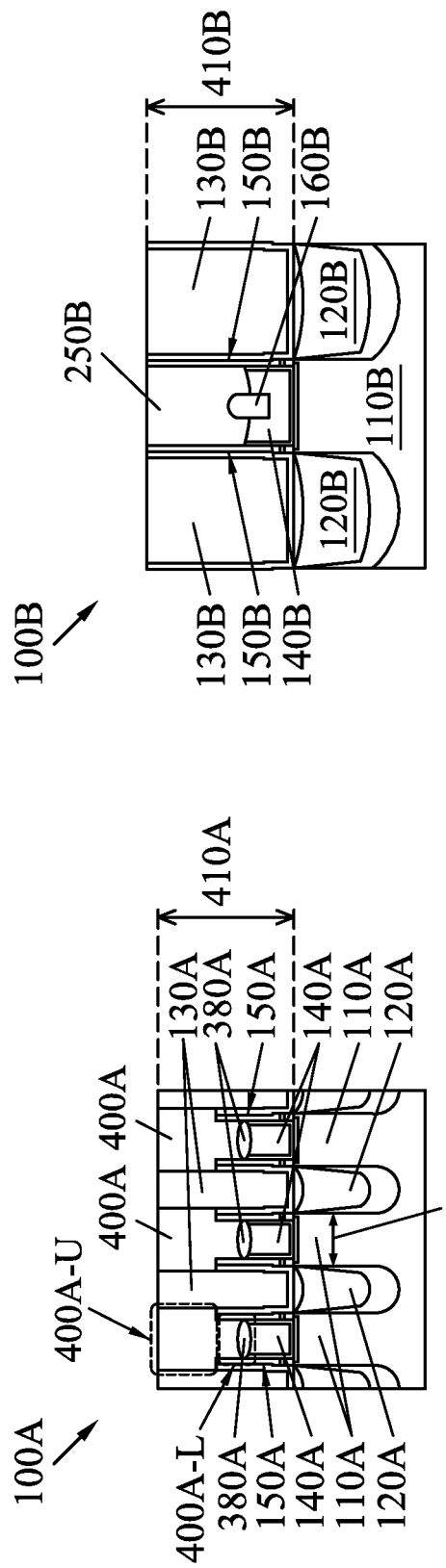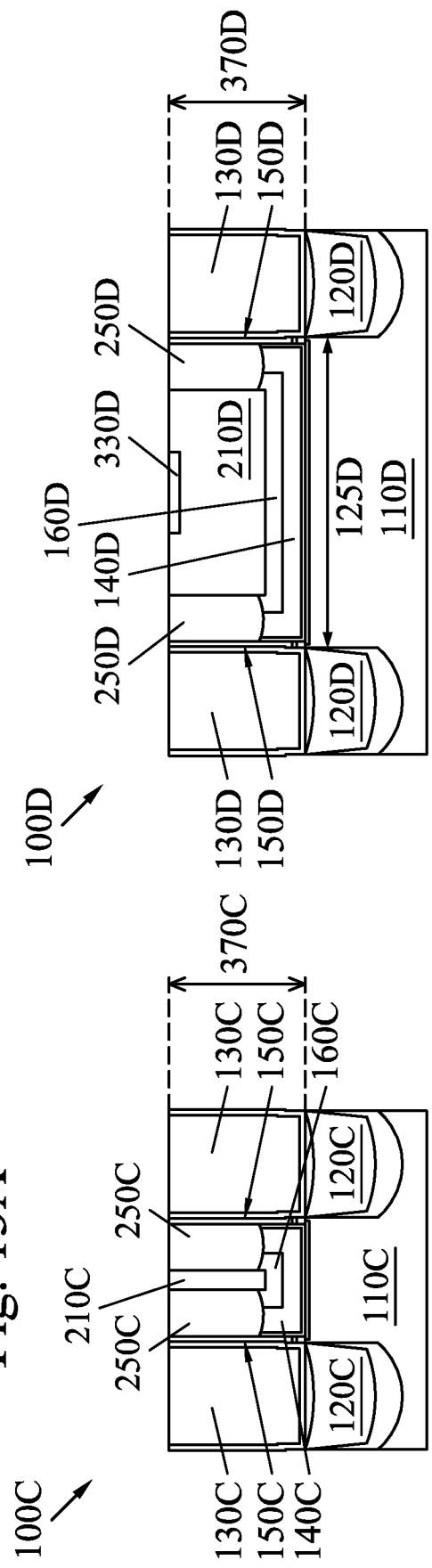
Fig. 13A
Fig. 13B
Fig. 13C
Fig. 13D

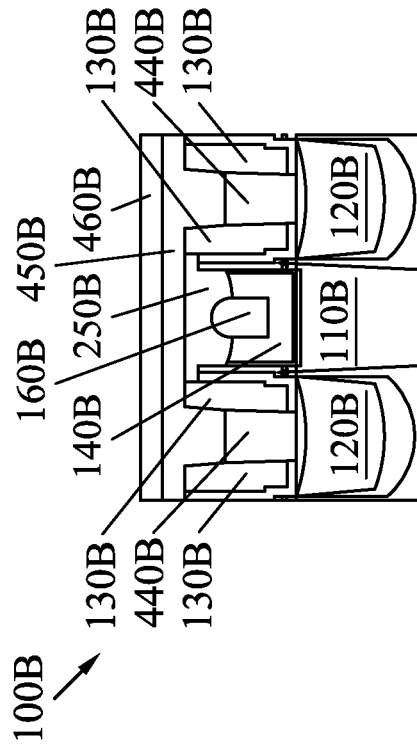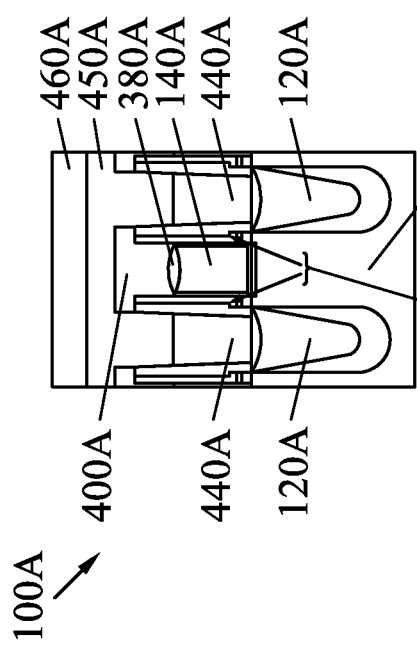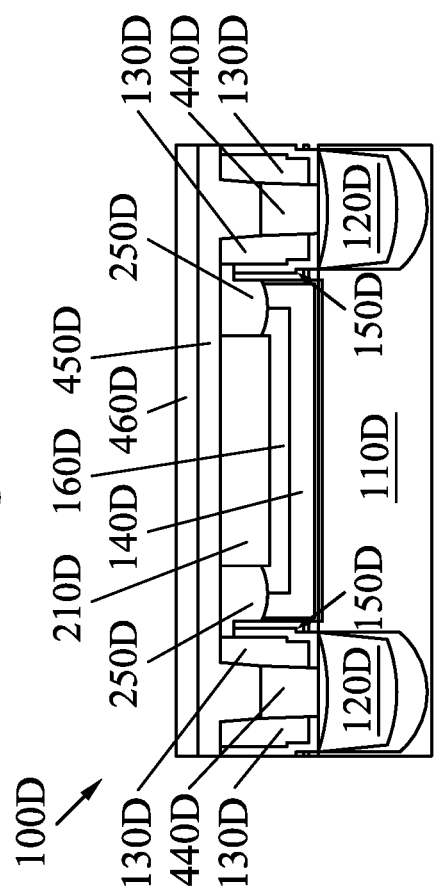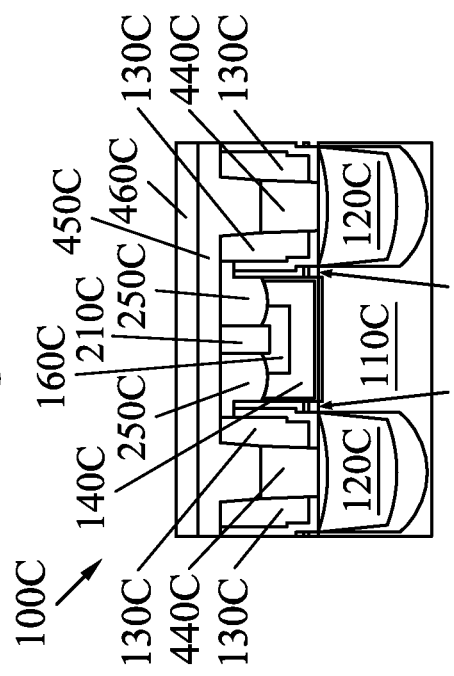

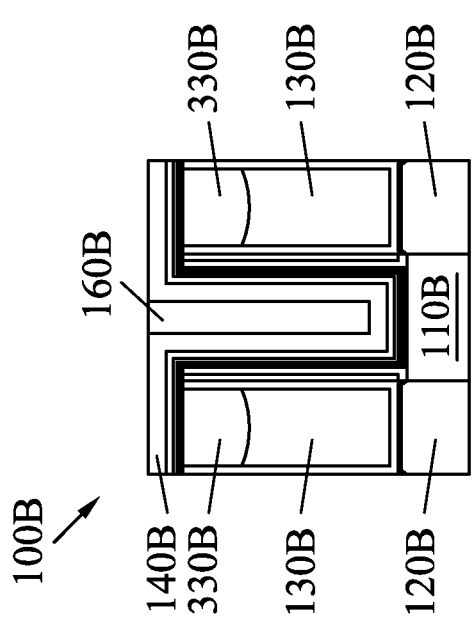
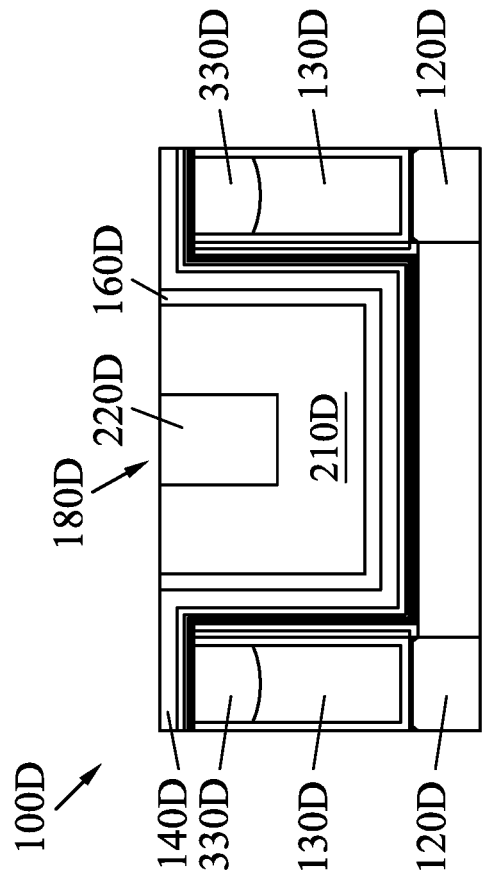
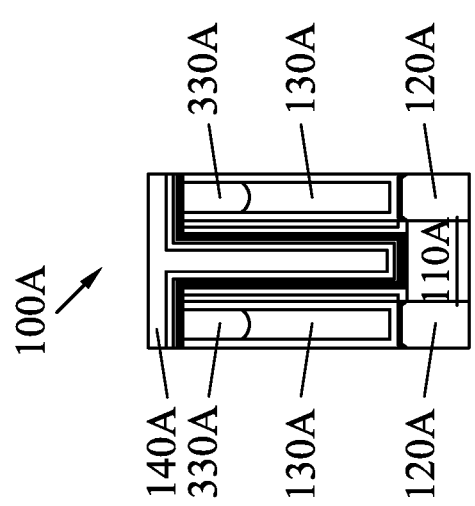

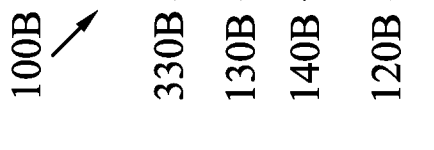
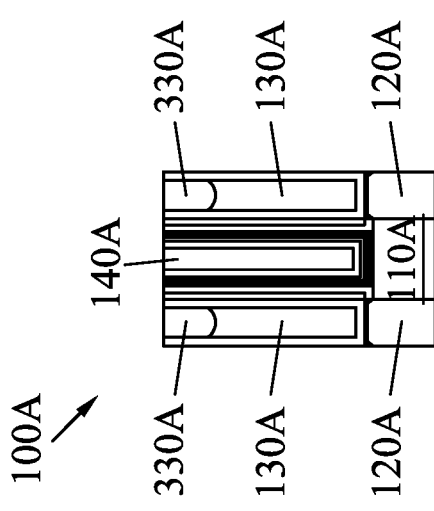
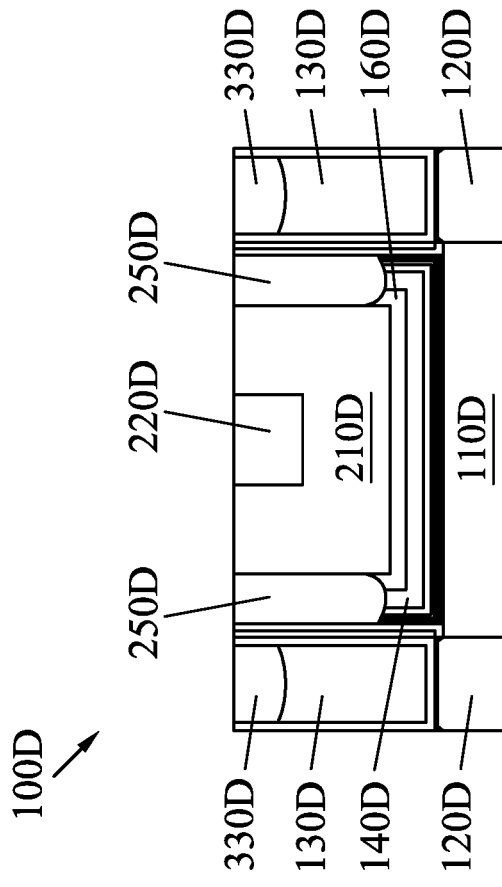
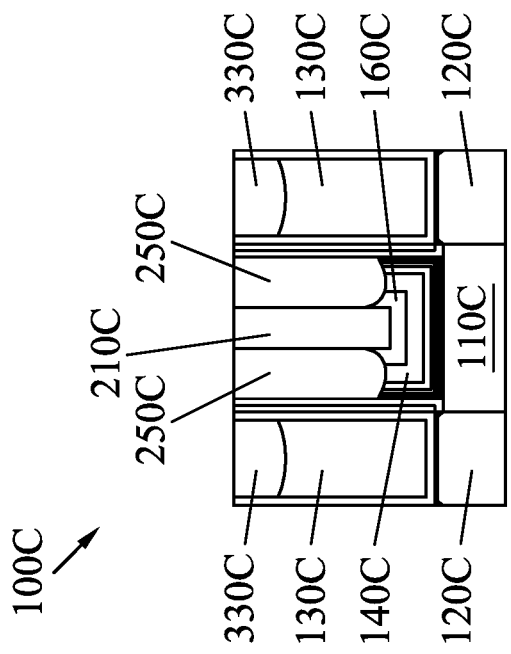

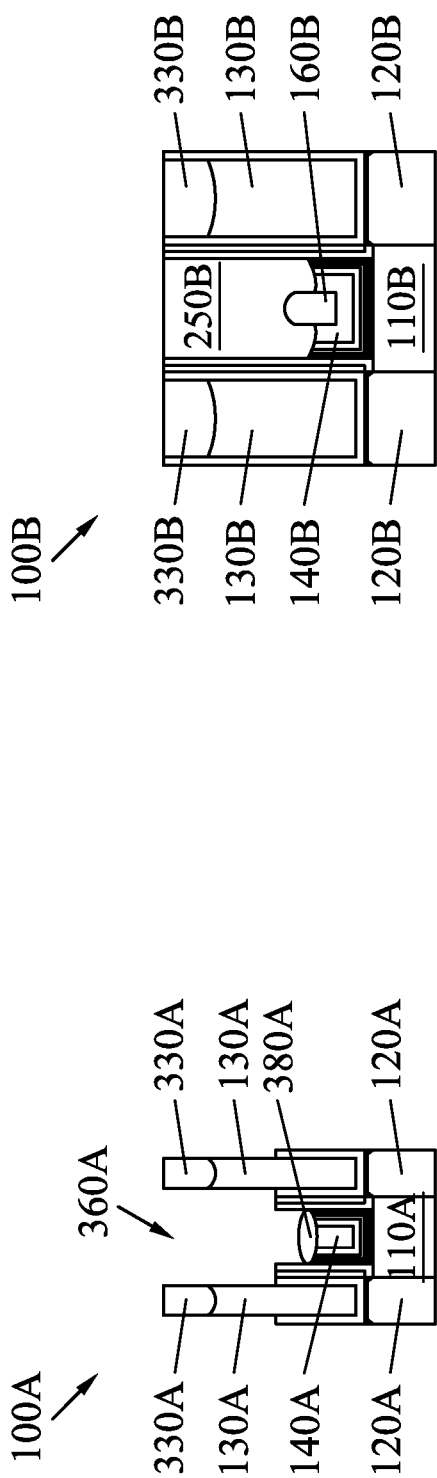
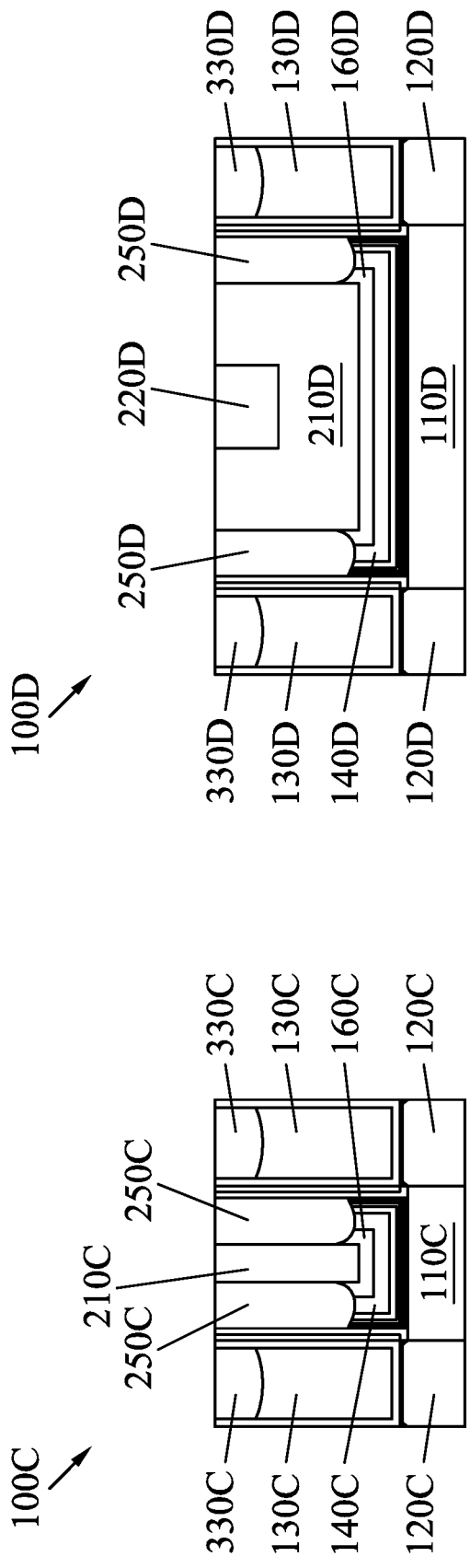
Fig. 19A
Fig. 19B
Fig. 19C
Fig. 19D

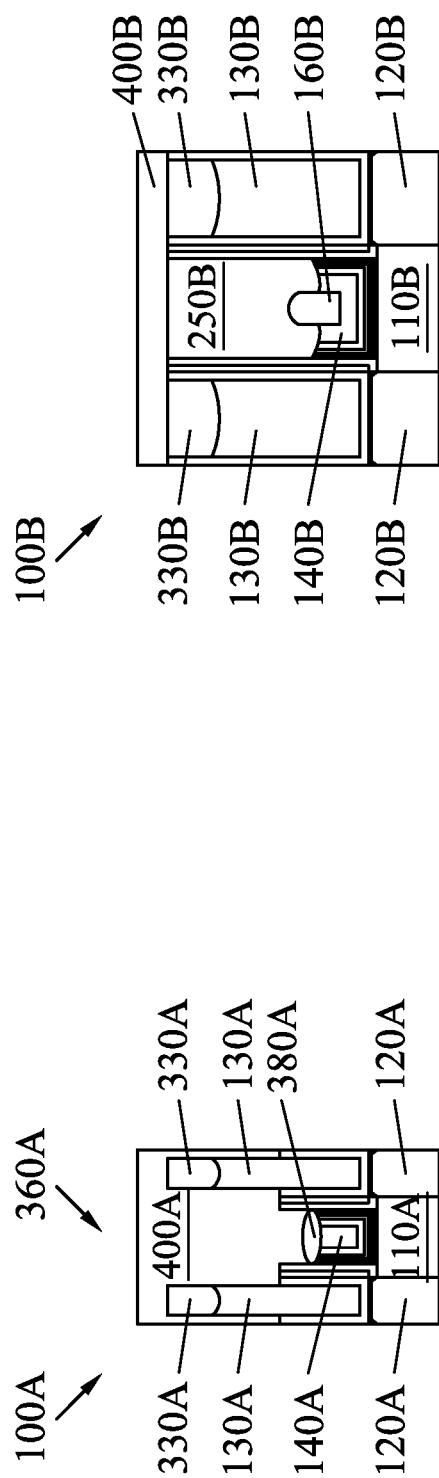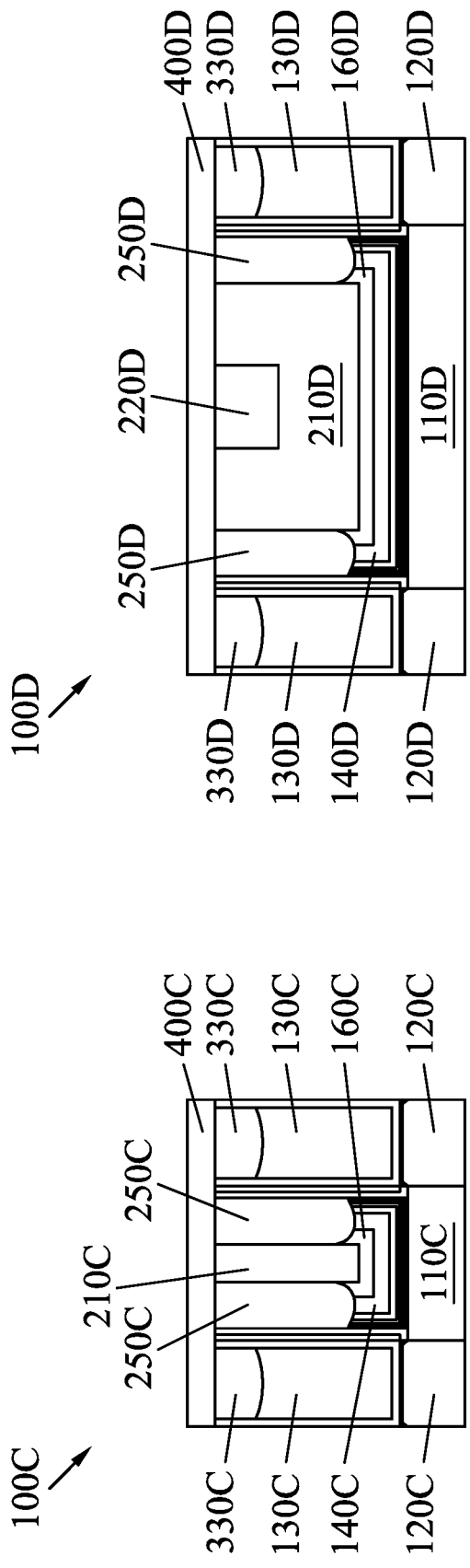
Fig. 20A
Fig. 20B
Fig. 20C
Fig. 20D

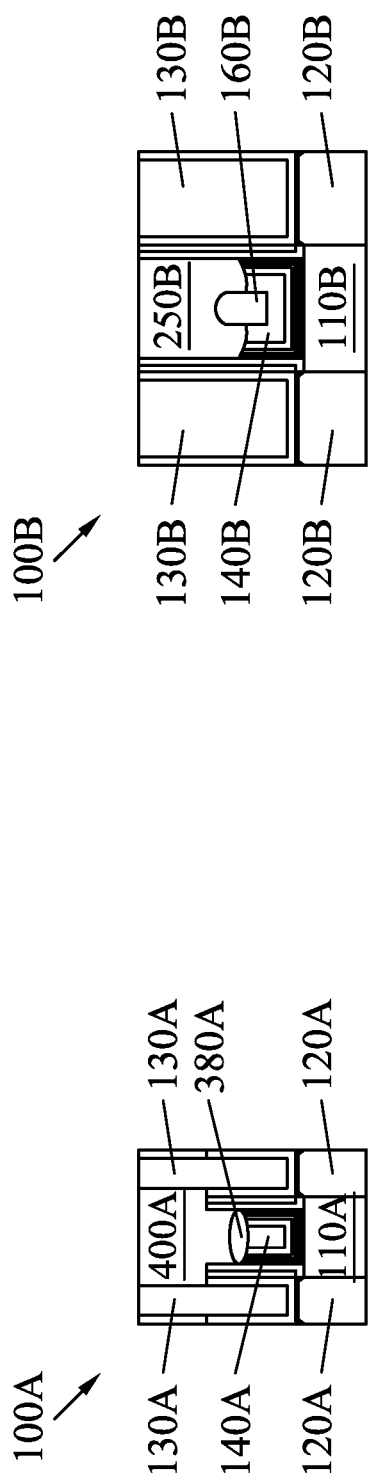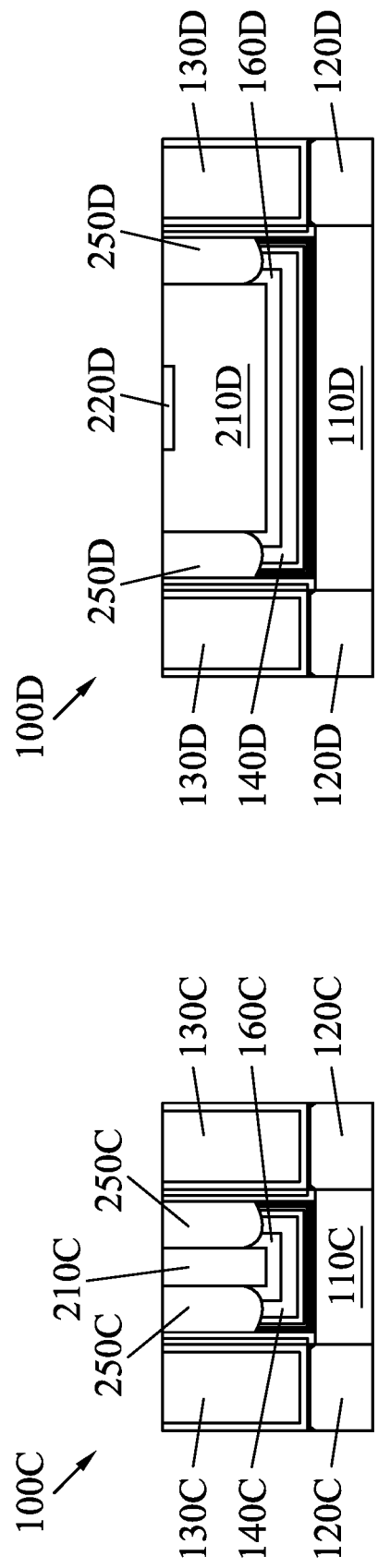

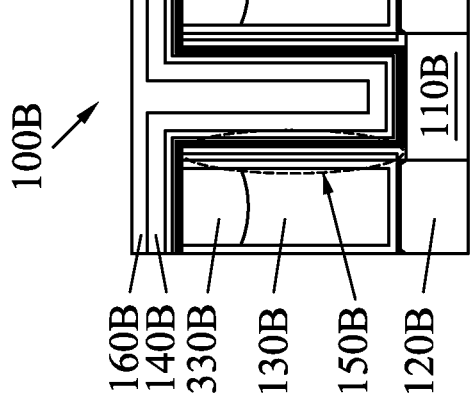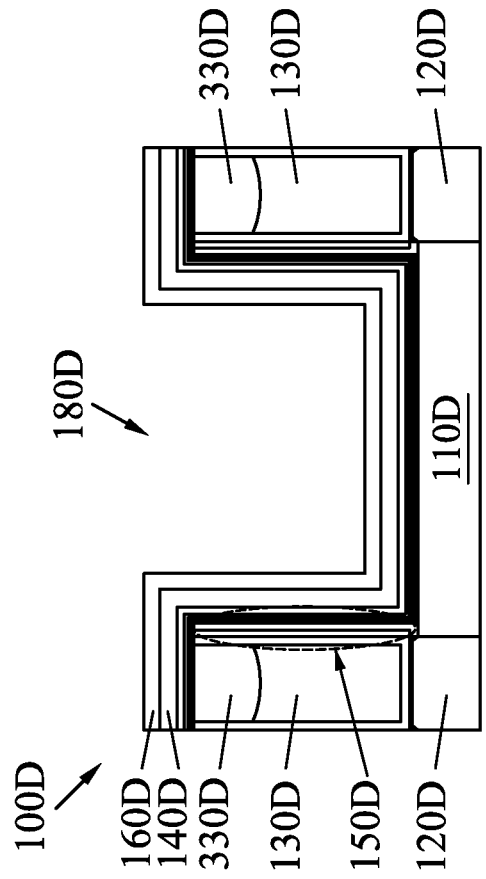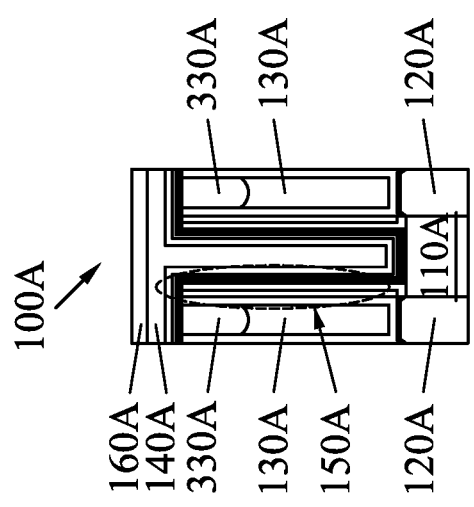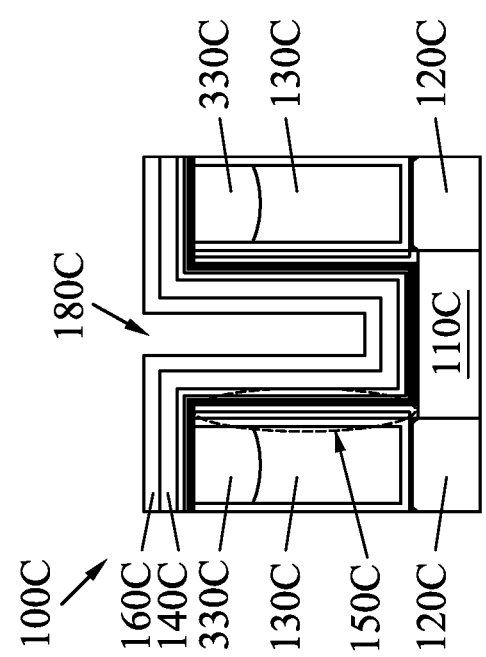

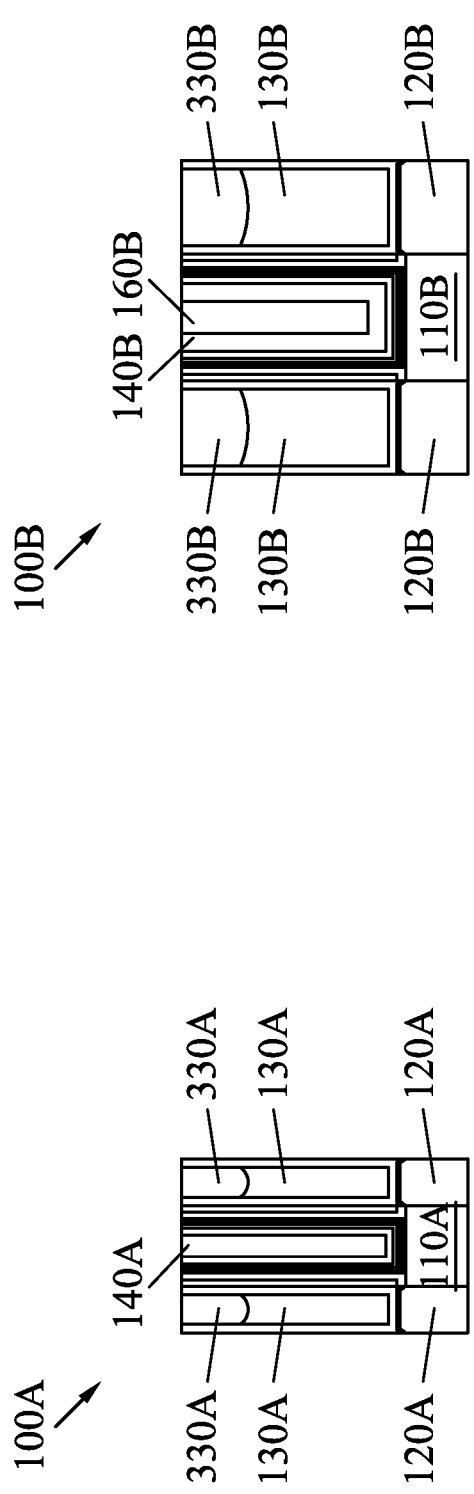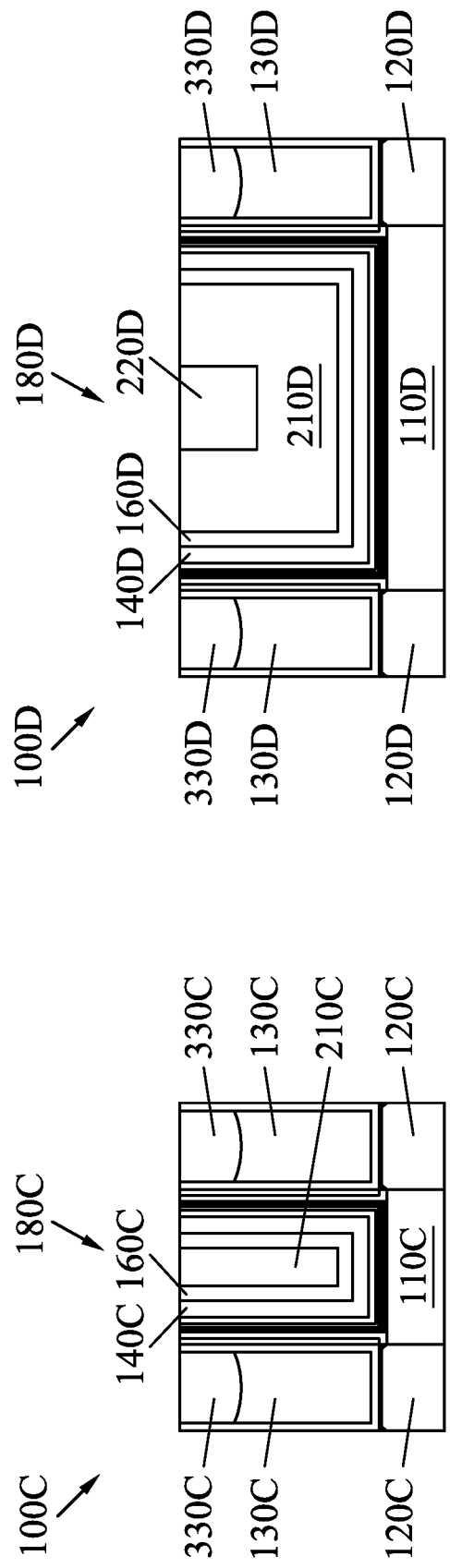

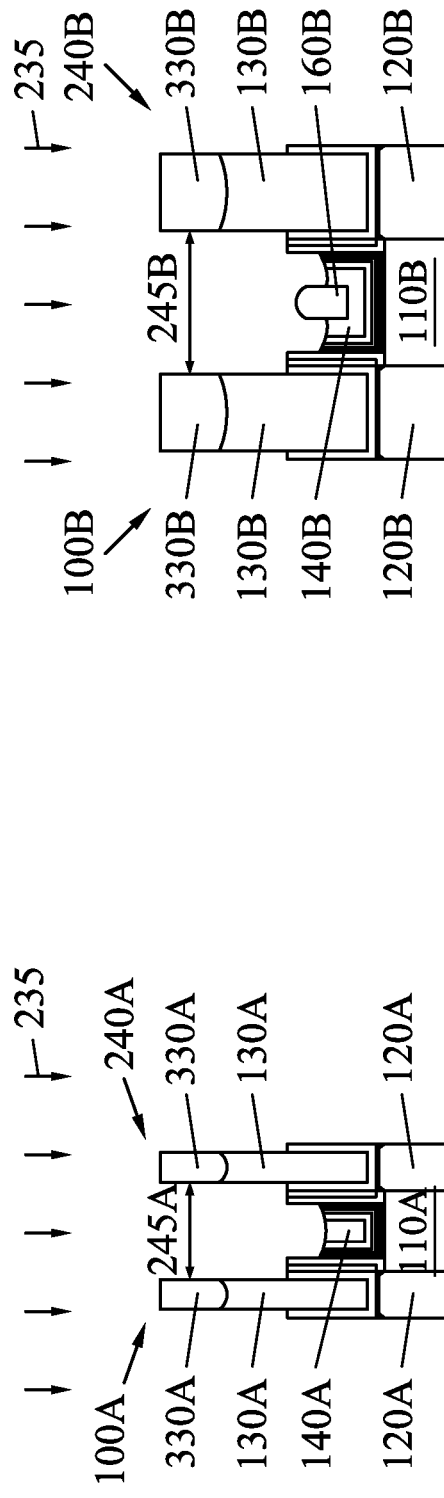
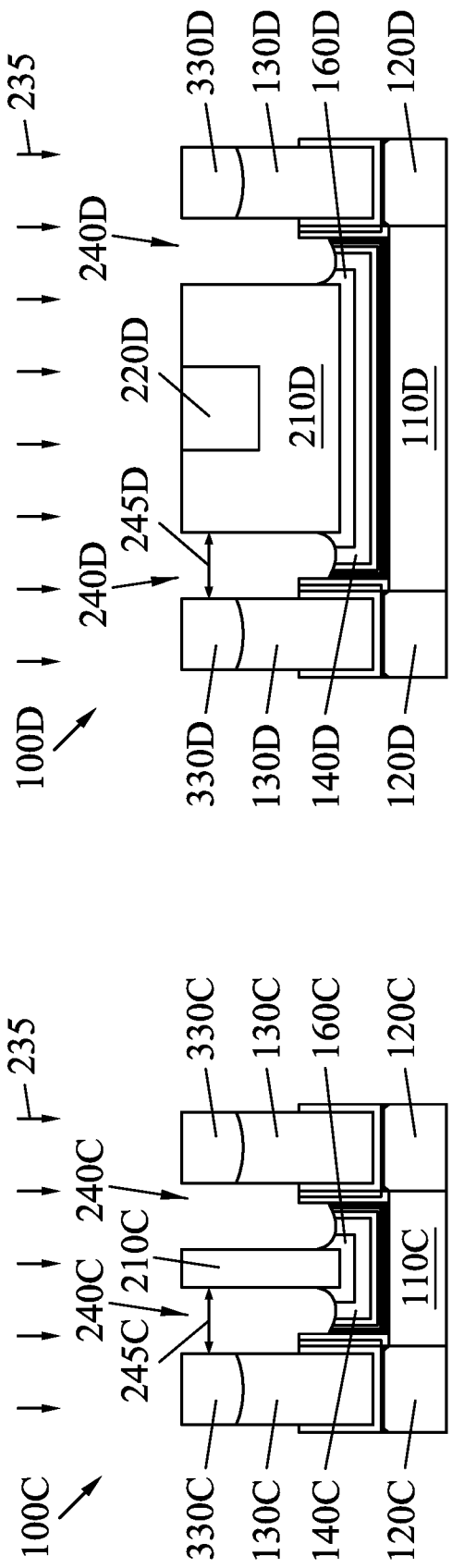
Fig. 25A  Fig. 25B  Fig. 25C  Fig. 25D

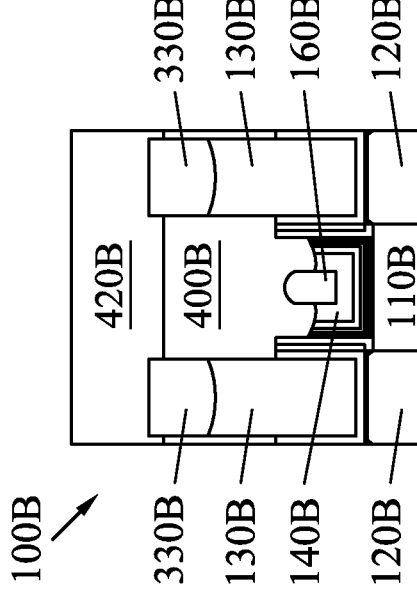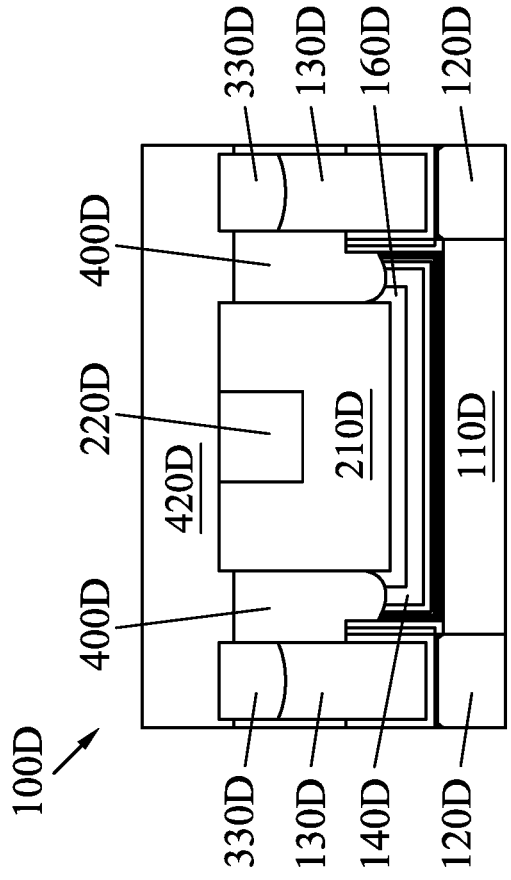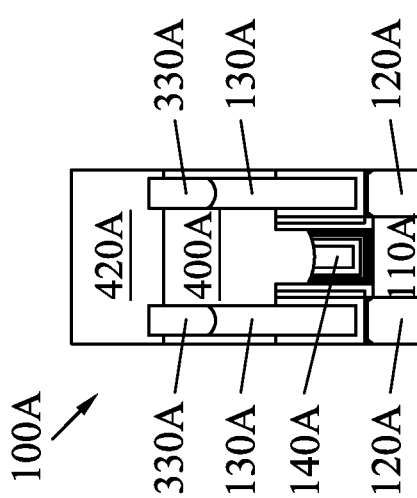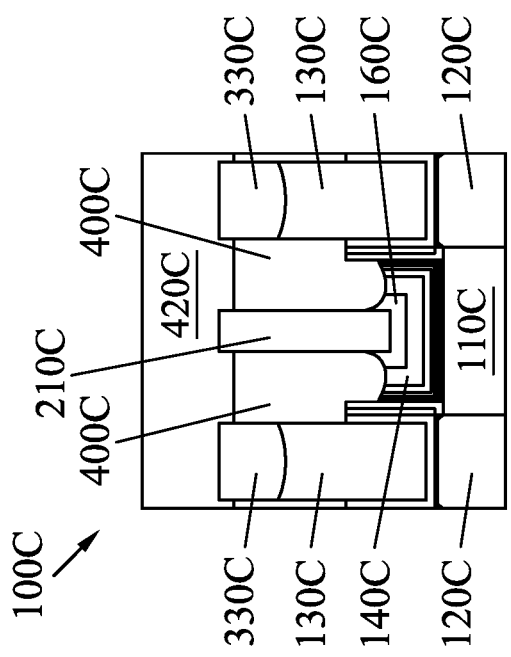

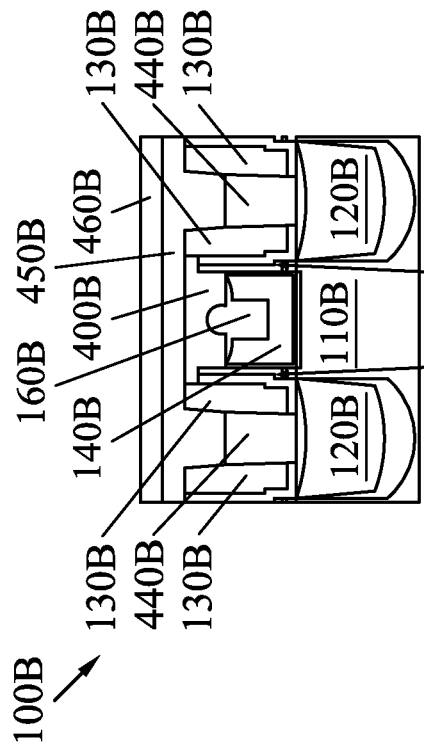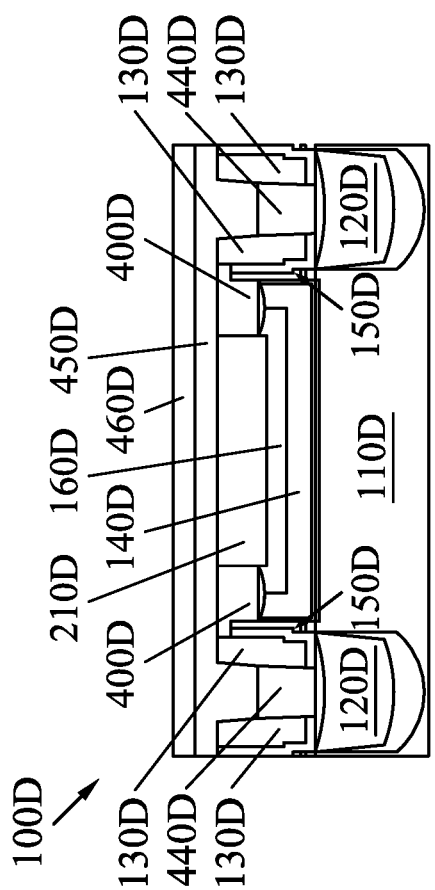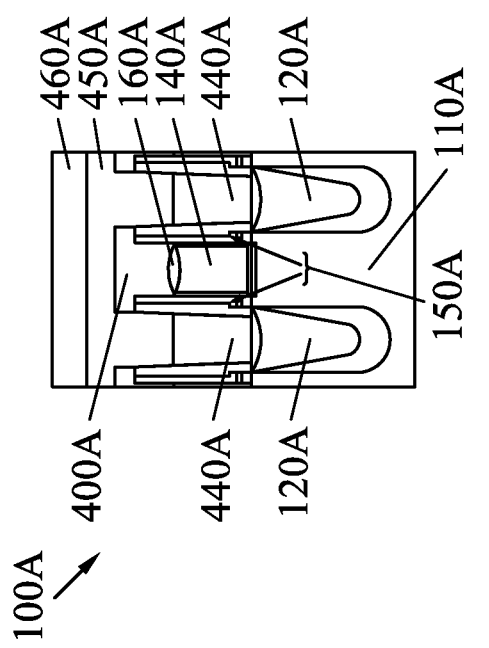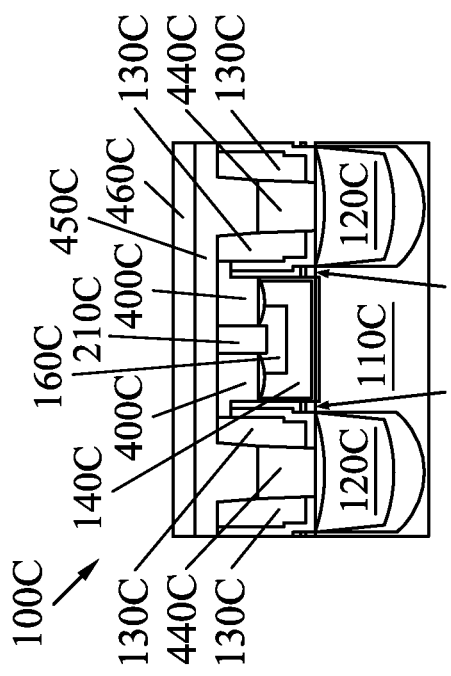
Fig. 29A
Fig. 29B
Fig. 29C
Fig. 29D

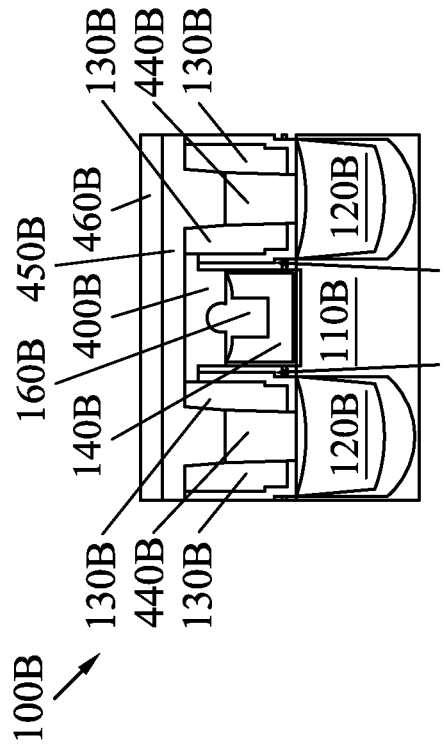
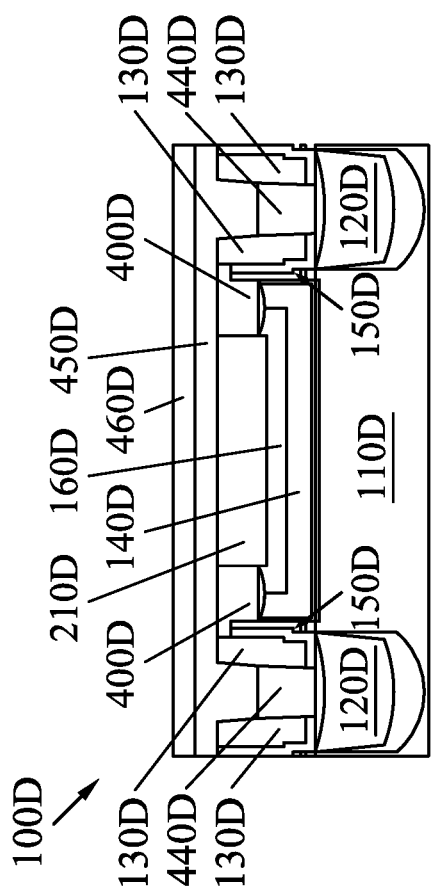
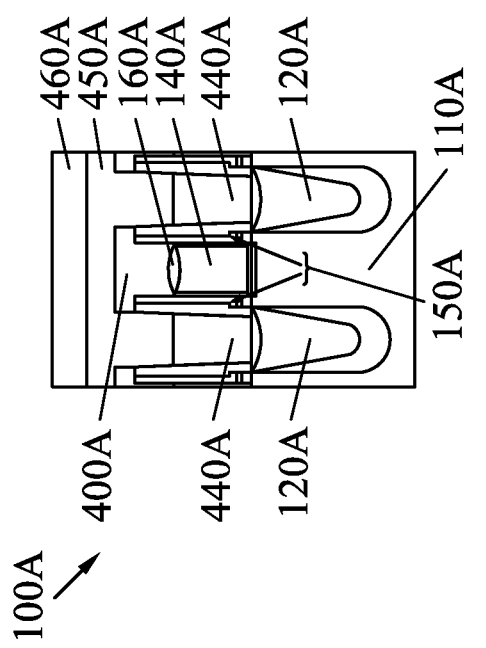
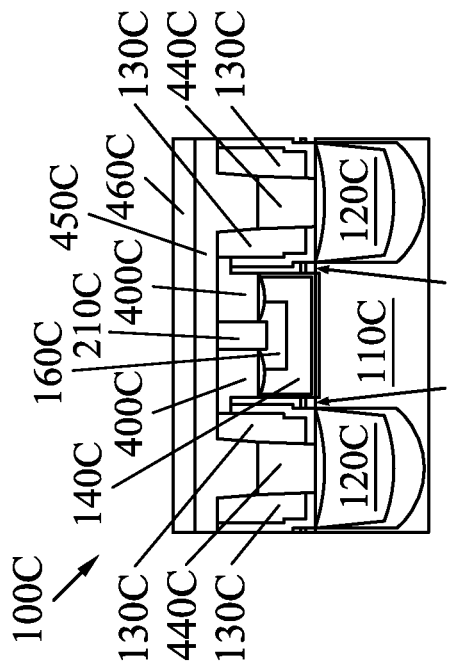
Fig. 30A
Fig. 30B
Fig. 30C
Fig. 30D

METHOD AND DEVICE FOR FORMING METAL GATE ELECTRODES FOR TRANSISTORS

PRIORITY DATA

The present application is a continuation Application of U.S. patent application Ser. No. 17/174,990, filed on Feb. 12, 2021, issued on Dec. 6, 2022 as U.S. Pat. No. 11,521,858, which is a divisional Application of U.S. patent application Ser. No. 16/370,258, filed on Mar. 29, 2019, issued on Feb. 23, 2021 as U.S. Pat. No. 10,930,763, which is a Utility Patent Application to U.S. Provisional Patent Application No. 62/736,087, filed on Sep. 25, 2018, entitled "METHOD AND DEVICE FOR FORMING METAL GATE ELECTRODES FOR TRANSISTORS", the disclosures of each of which are hereby incorporated by reference in their respective entireties.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created u sing a fabrication process) has decreased.

The decreased geometry sizes lead to challenges in semiconductor fabrication. For example, as geometry sizes continue to decrease, loading (e.g., due to components having different sizes) may become a concern. For example, loading issues could lead to excessive loss of a gate height of a transistor. When this occurs, the result is degraded device performance or even device failures.

Therefore, while existing semiconductor devices and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-33A, 2B-33B, 2C-33C, and 2D-33D are cross-sectional views of semiconductor devices at various stages of fabrication according to various embodiments of the present disclosure.

DETAILED DESCRIPTION

Figure 1:
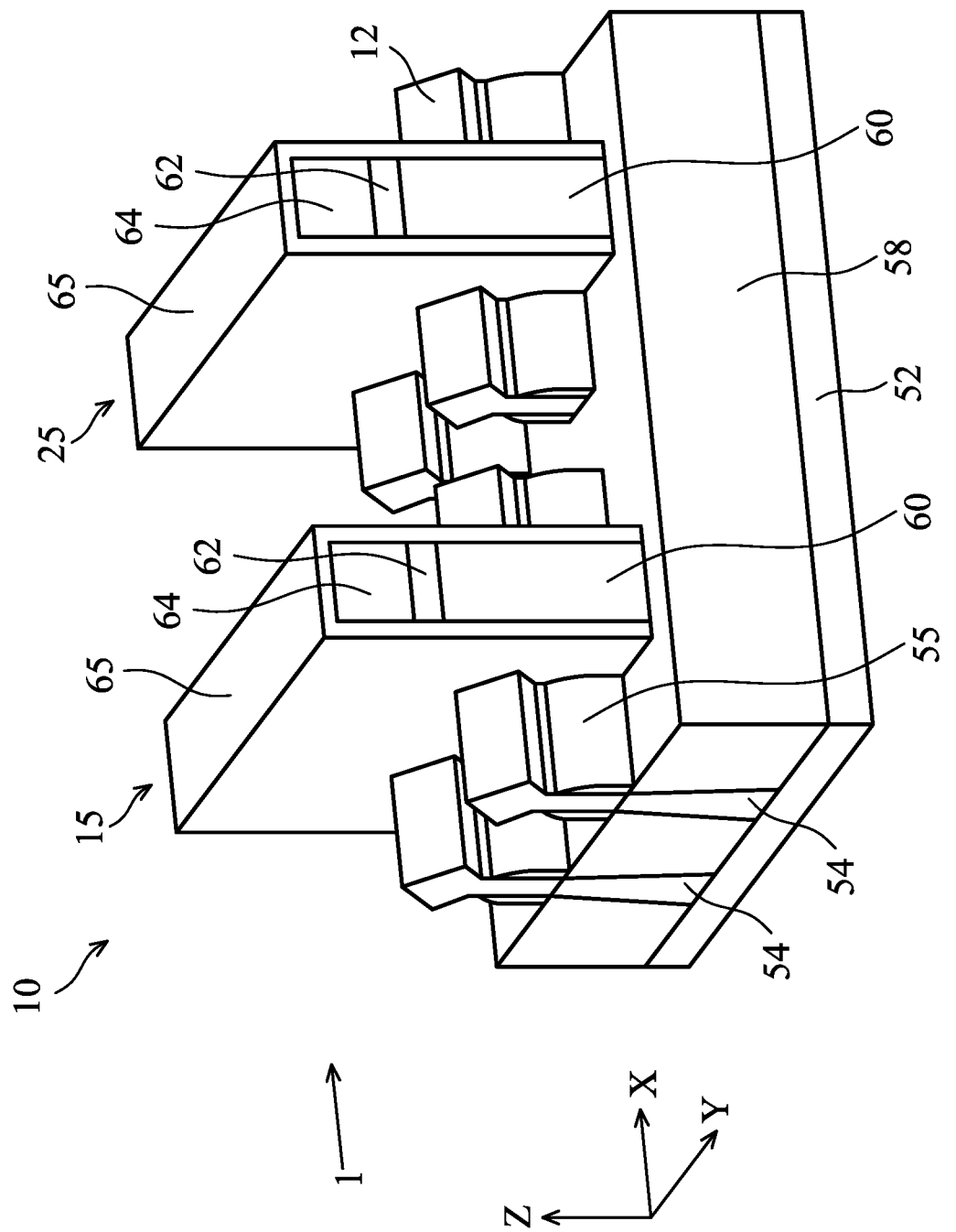
FIG. 1 is a perspective view of an example FinFET device.
Figure 3A:
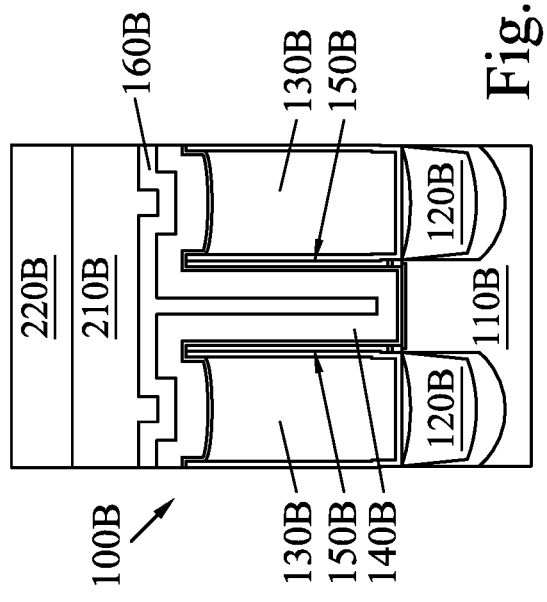
Figure 3B:
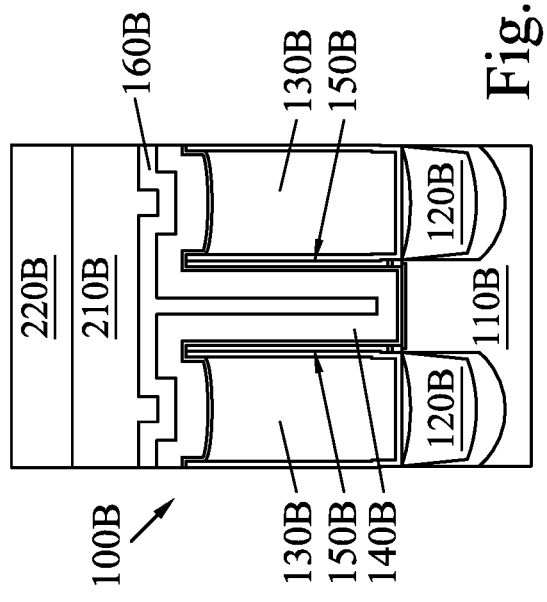
Figure 3C:
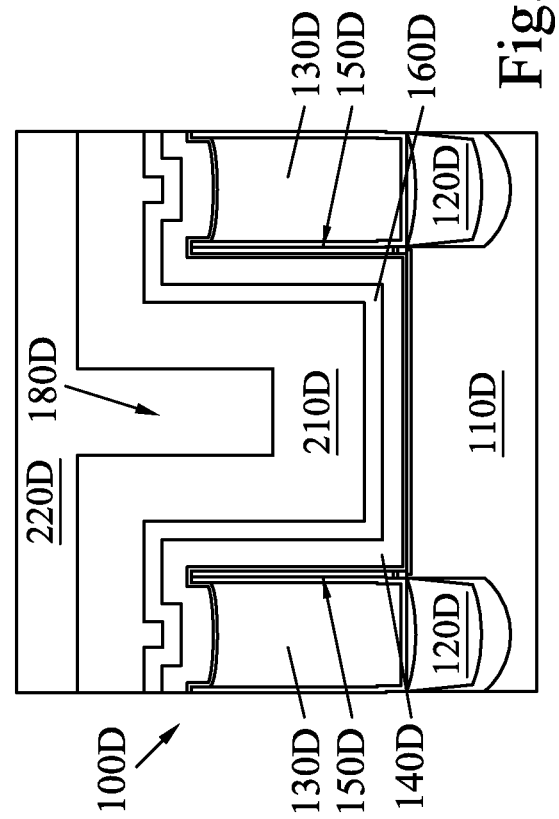
Figure 3D:
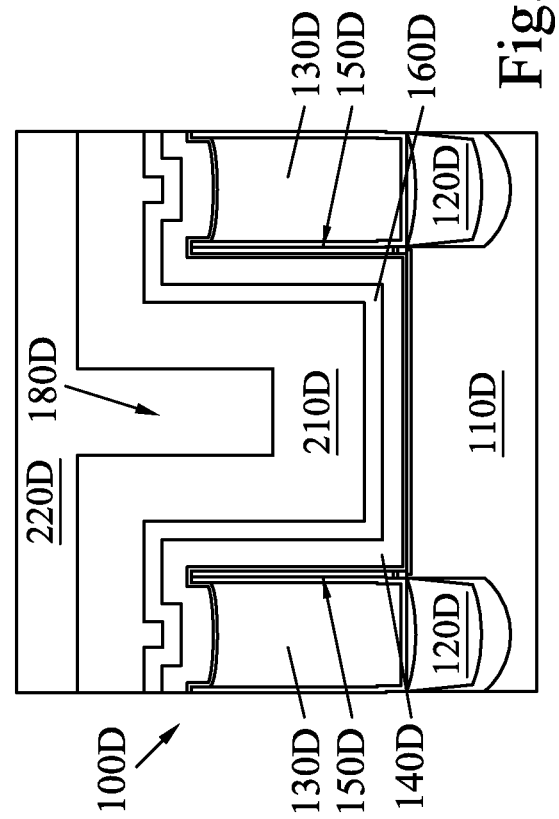
Figure 4B:
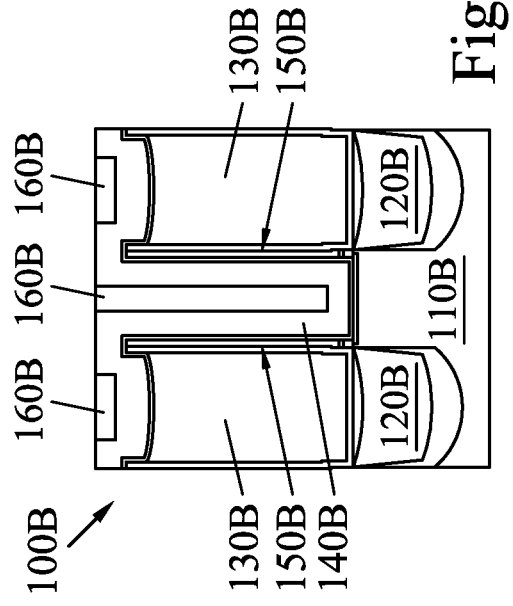
Figure 4D:
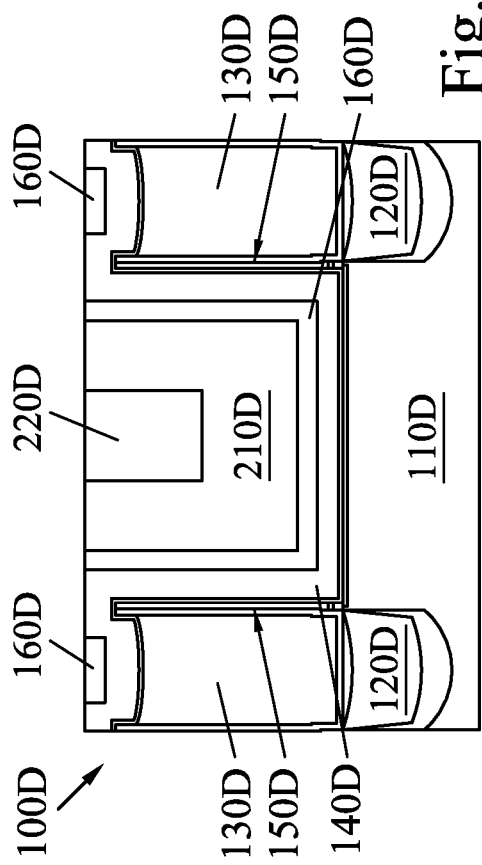
Figure 4A:
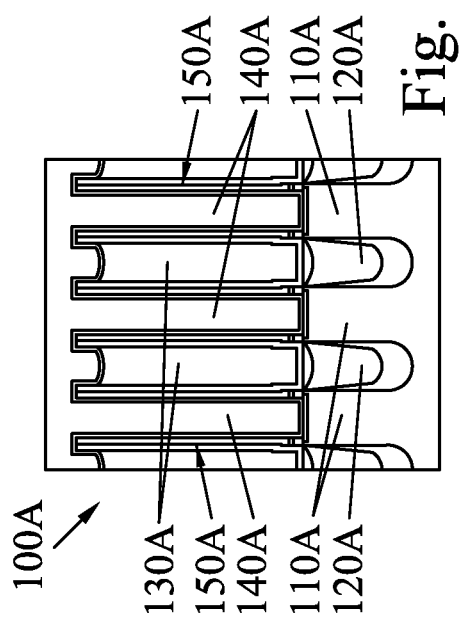
Figure 4C:
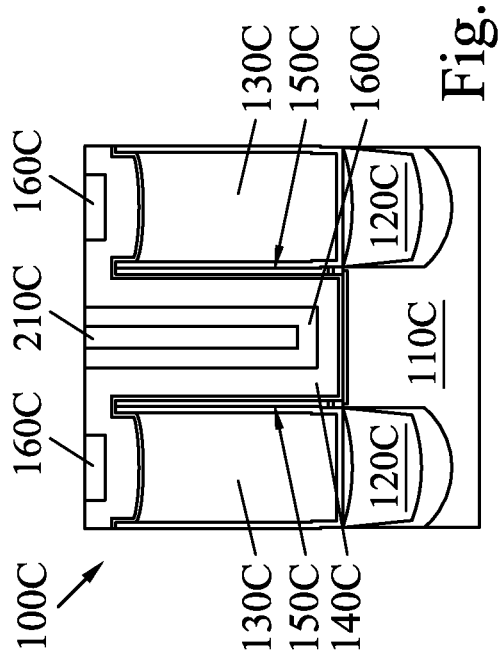
Figure 15B:
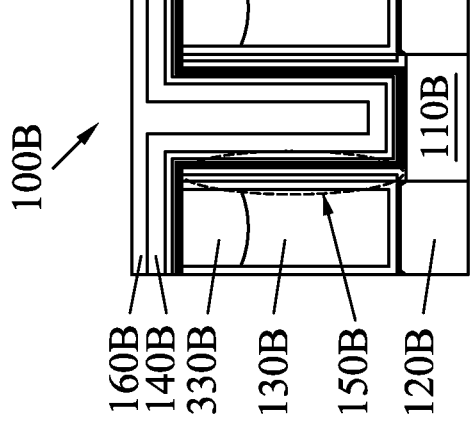
Figure 15D:
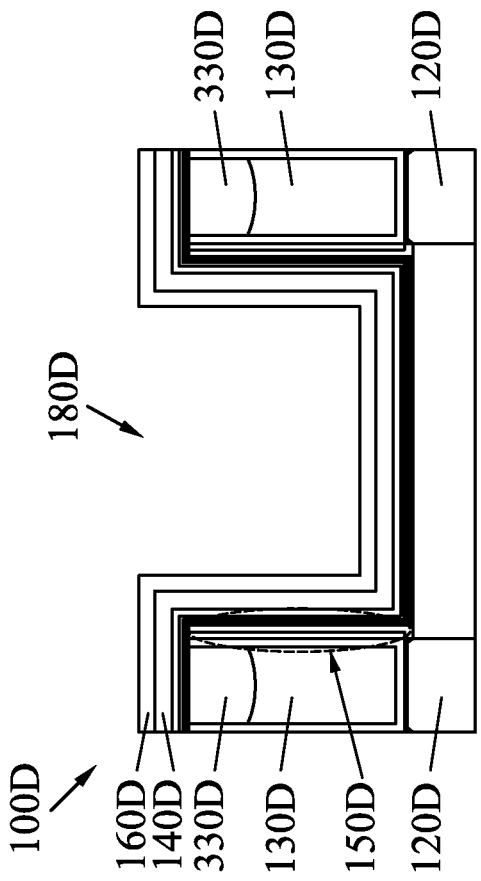
Figure 15A:
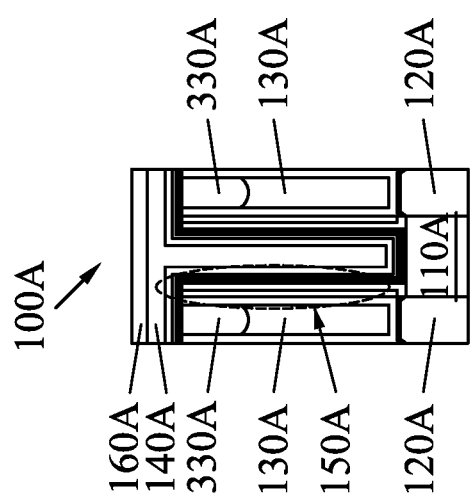
Figure 15C:
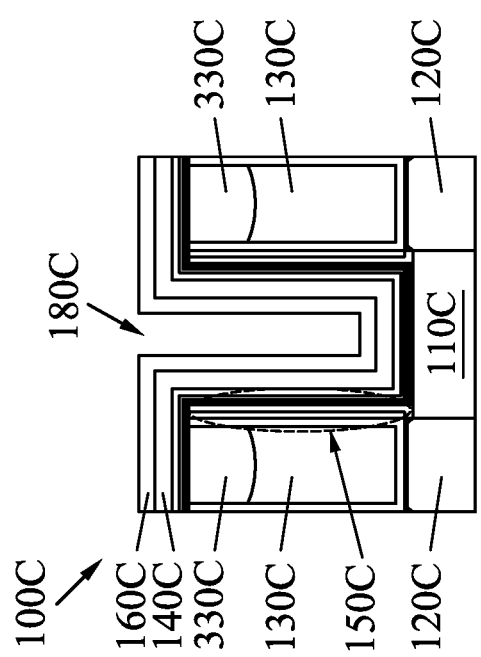
Figure 17A:
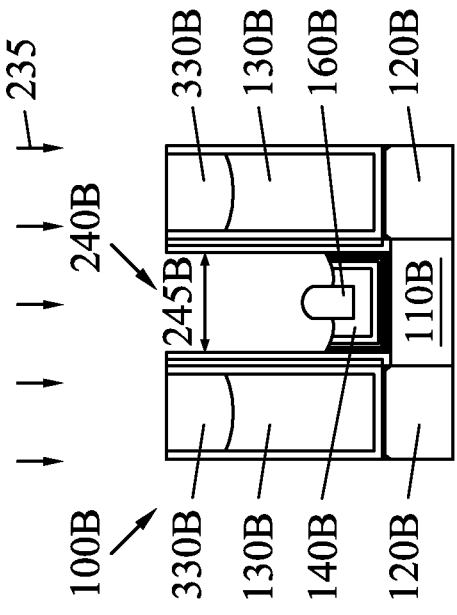
Figure 17B:
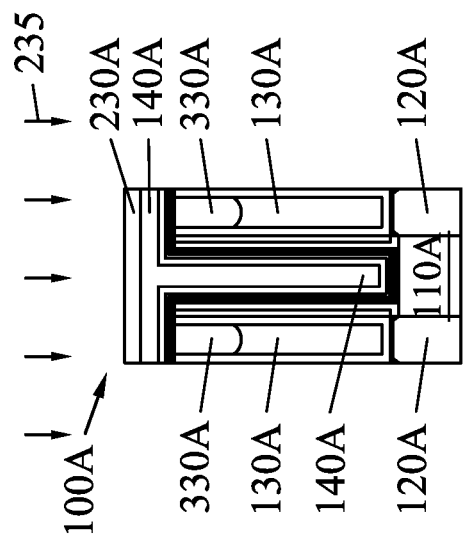
Figure 17C:
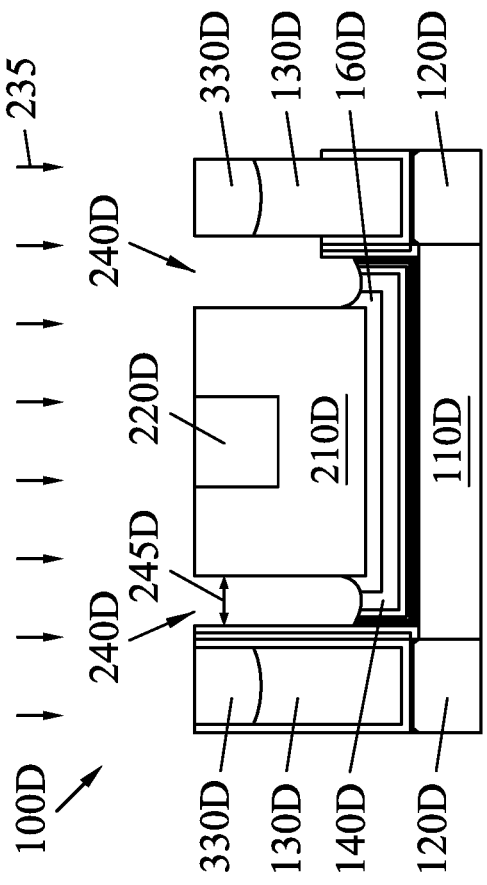
Figure 17D:
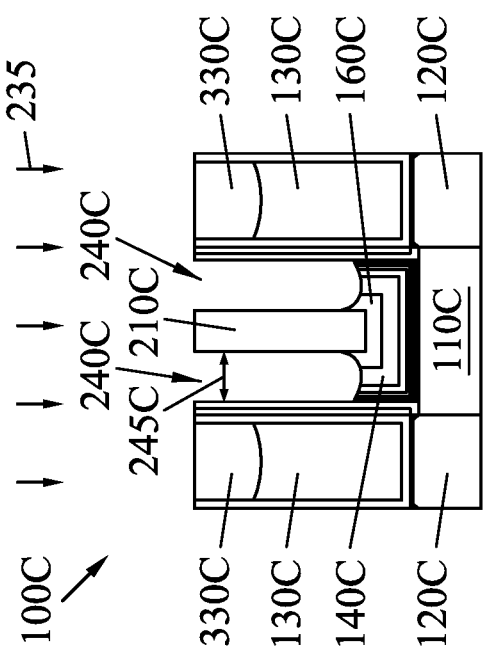
Figure 21A:
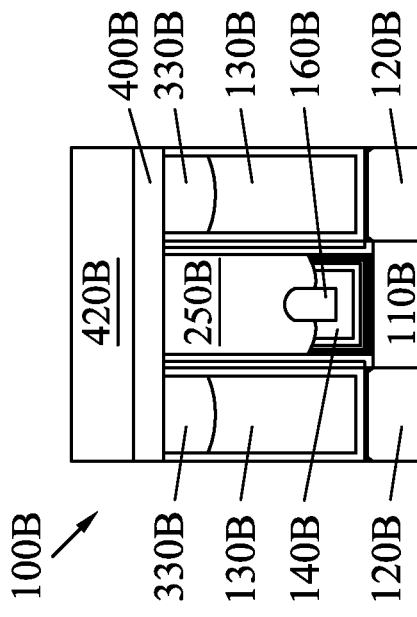
Figure 21C:
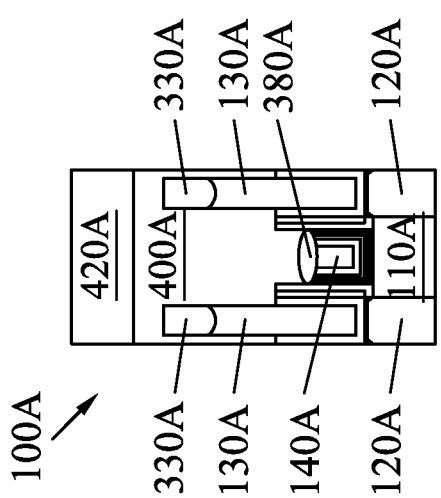
Figure 21B:
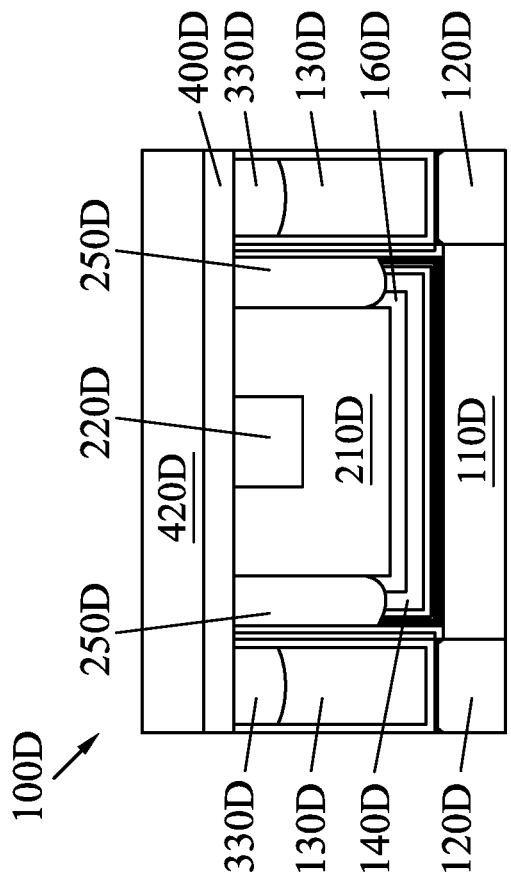
Figure 21D:
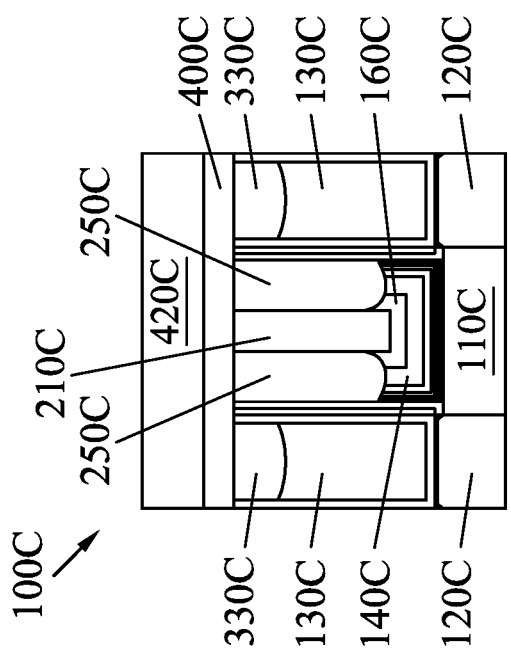
Figure 26A:
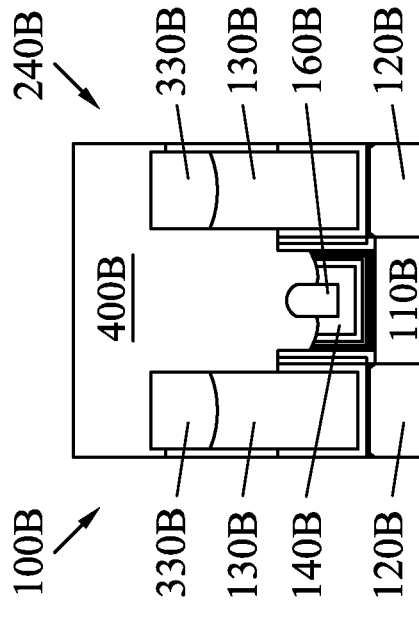
Figure 26B:
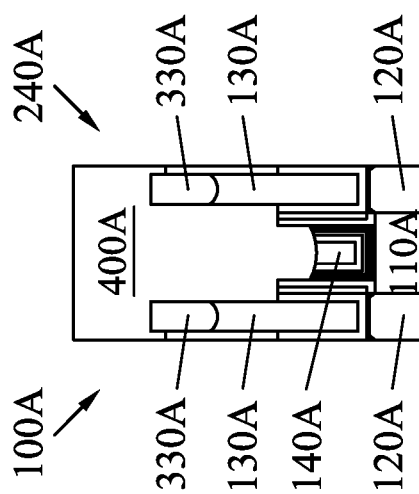
Figure 26C:
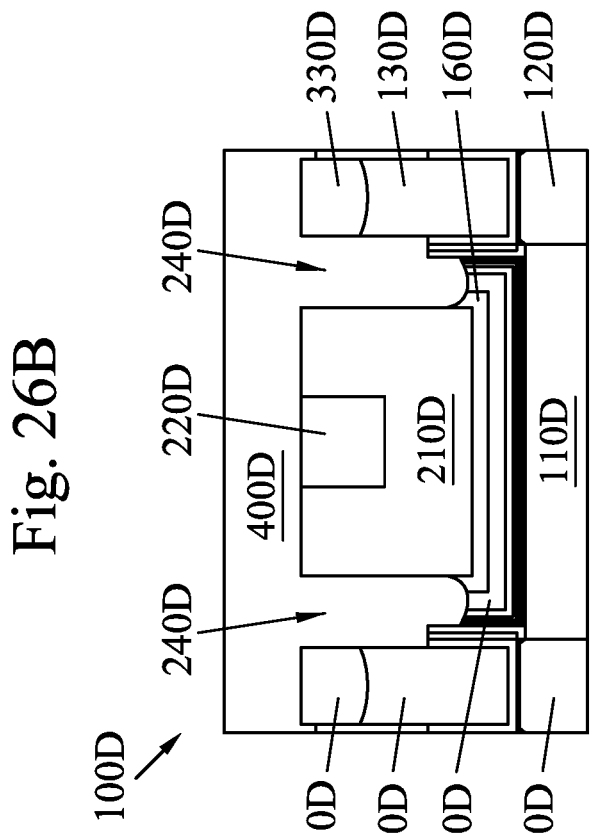
Figure 26D:
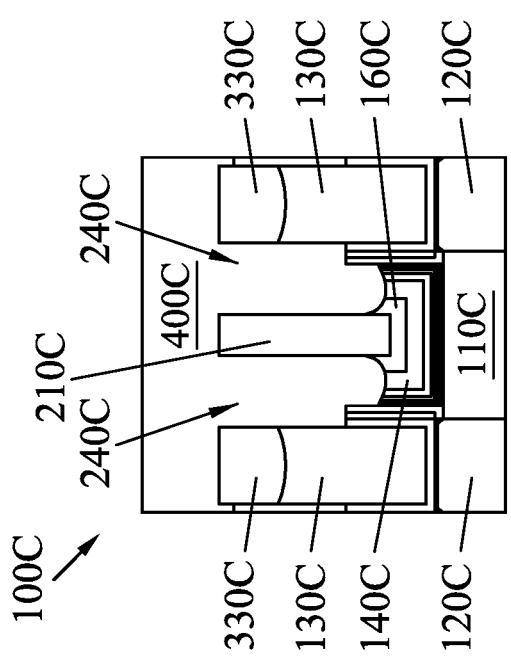
Figure 28A:
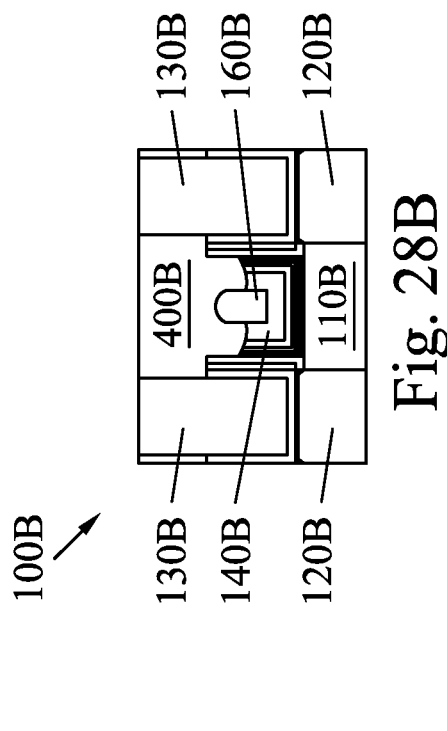
Figure 28B:
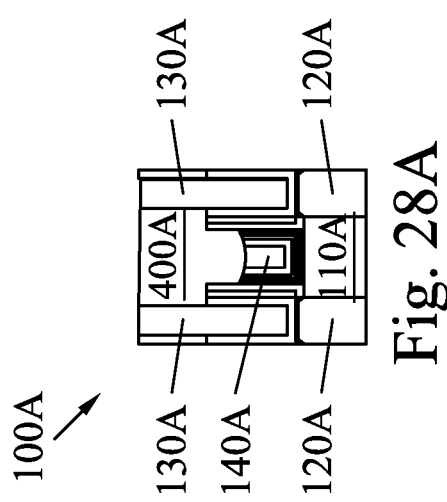
Figure 28C:
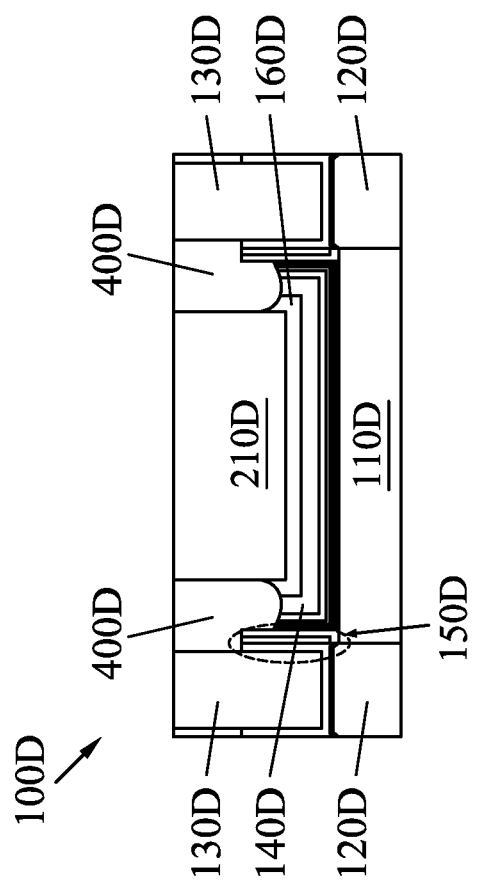
Figure 28D:
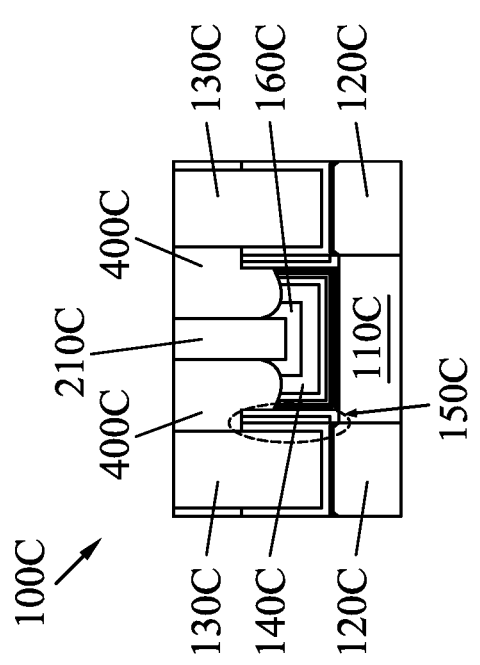
Figure 31A:
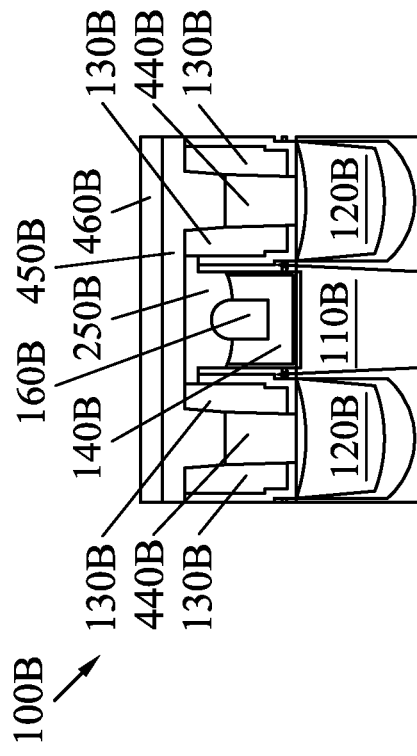
Figure 31B:
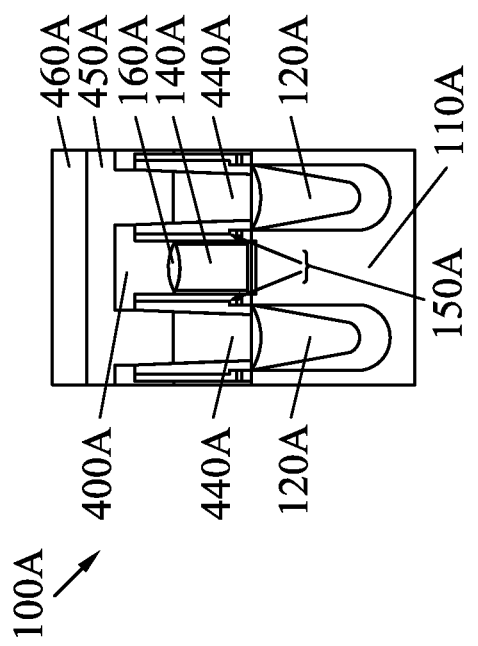
Figure 31C:
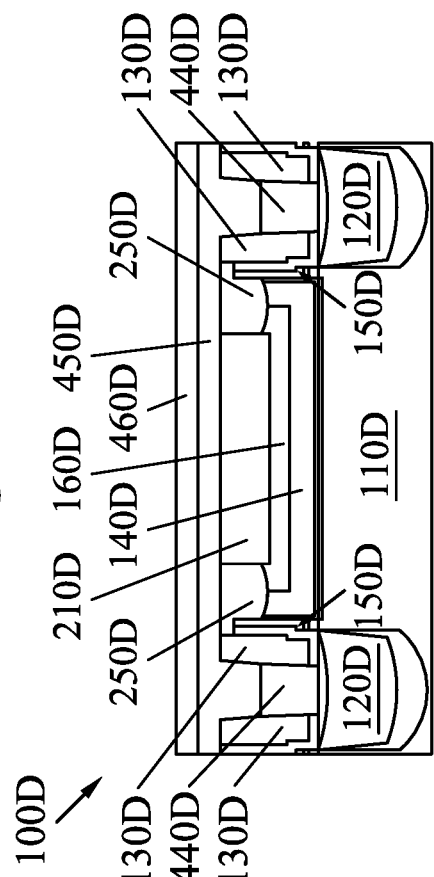
Figure 31D:
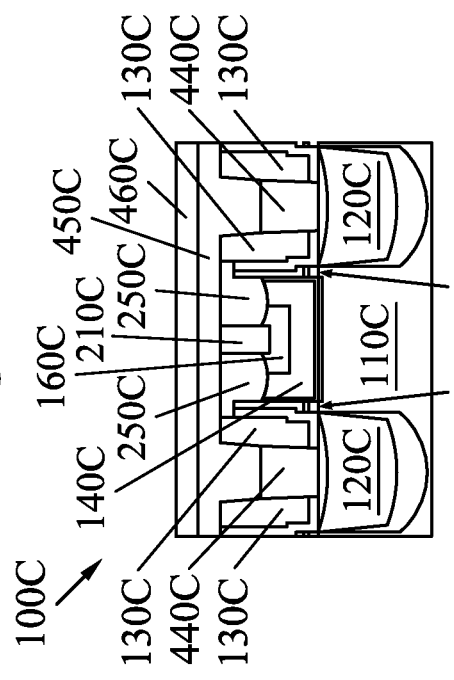
Figure 32A:
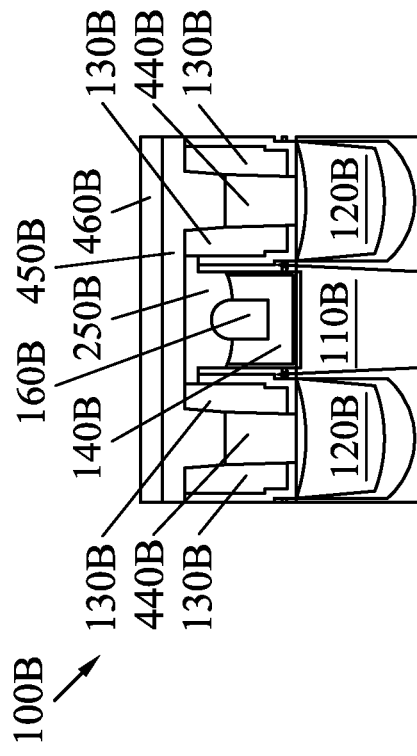
Figure 32C:
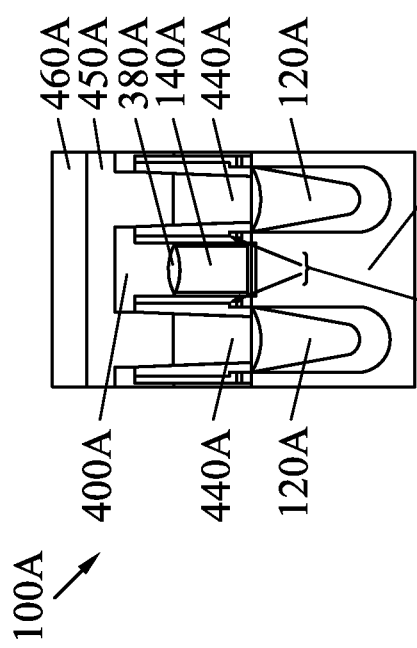
Figure 32B:
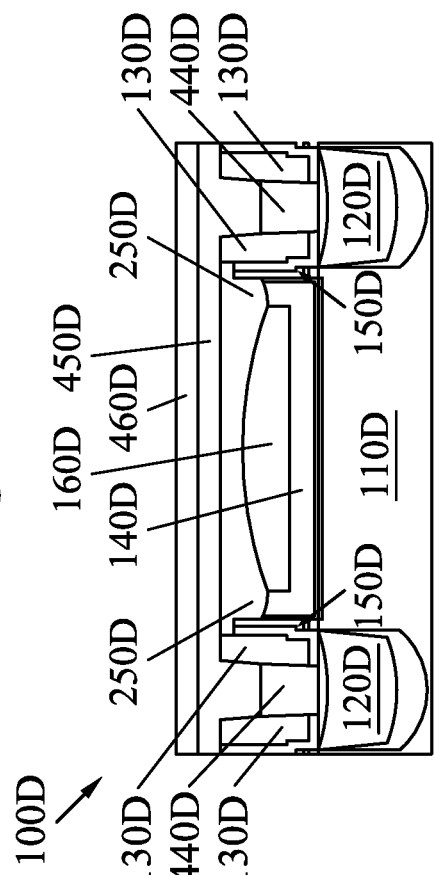
Figure 32D:
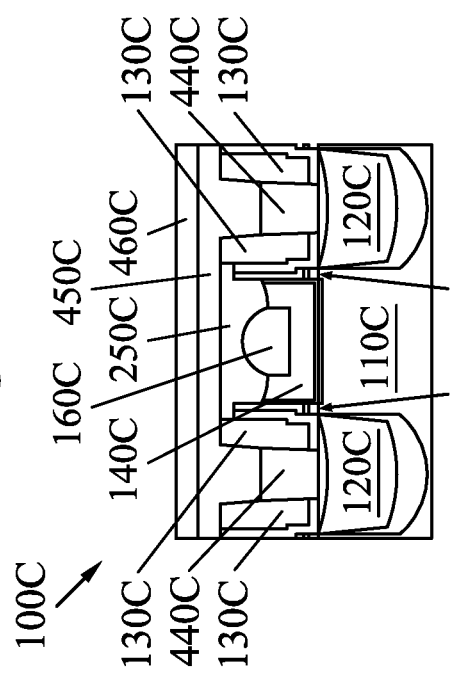
Figure 33A:
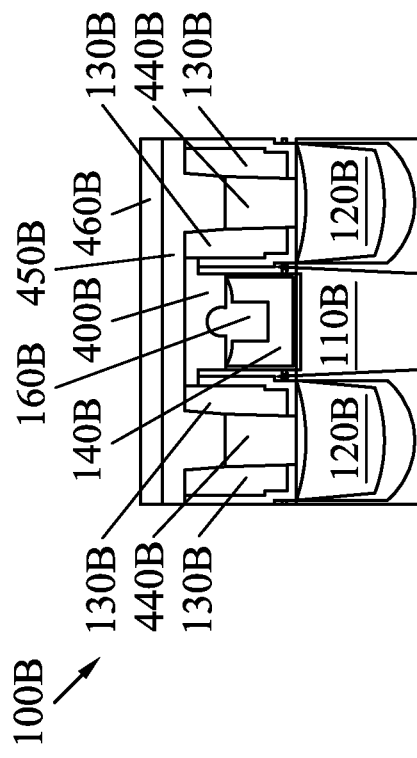
Figure 33B:
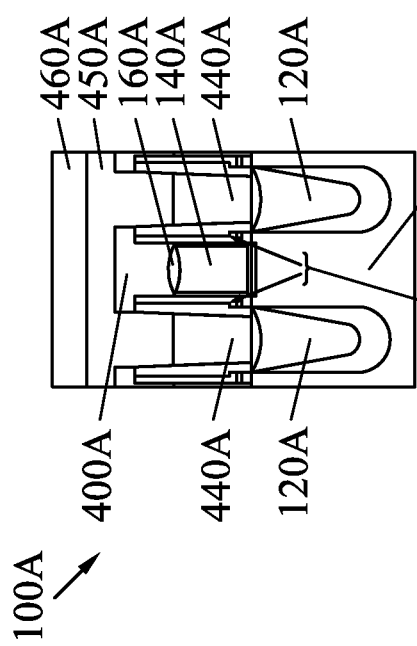
Figure 33C:
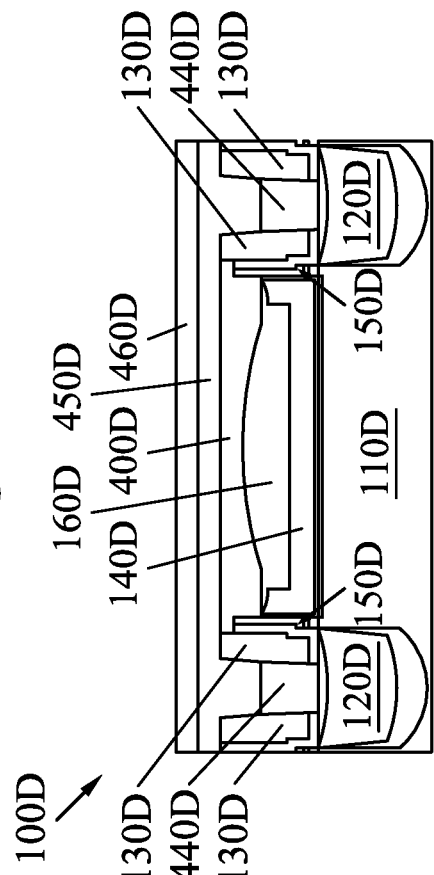
Figure 33D:
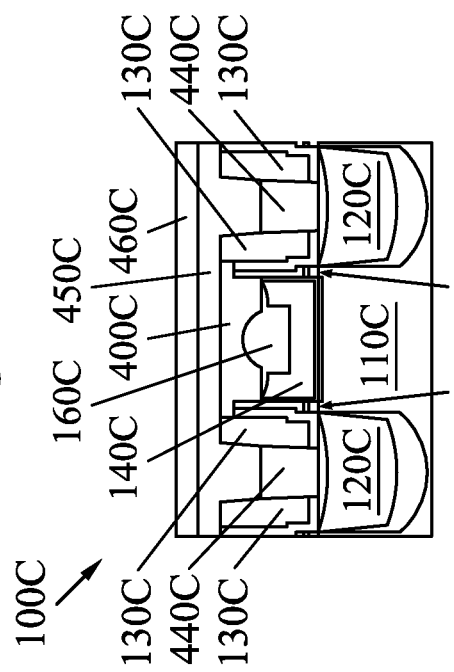

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a method to perform semiconductor fabrication, for example an aspect of semiconductor fabrication pertaining to metal gate electrode formation. To illustrate the various aspects of the present disclosure, a FinFET fabrication process is discussed below as a non-limiting example. In that regard, a FinFET device is a fin-like field-effect transistor device, which has been gaining popularity in the semiconductor industry. The FinFET device may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure, but it is understood that the application is not limited to the FinFET device, except as specifically claimed. In other words, the various aspects of the present disclosure may be applied in the fabrication of two-dimensional planar transistors too.

Referring to FIG. 1, a perspective view of an example FinFET device 10 is illustrated. The FinFET device structure 10 includes a N-type FinFET device structure (NMOS) 15 and a P-type FinFET device structure (PMOS) 25. The FinFET device structure 10 includes a substrate 52. The substrate 52 may be made of silicon or other semiconductor materials. Alternatively or additionally, the substrate 52 may include other elementary semiconductor materials such as germanium. In some embodiments, the substrate 52 is made of a compound semiconductor such as silicon carbide, gallium arsenic, indium arsenide, or indium phosphide. In some embodiments, the substrate 52 is made of an alloy semiconductor such as silicon germanium, silicon germanium carbide, gallium arsenic phosphide, or gallium indium phosphide. In some embodiments, the substrate 52 includes an epitaxial layer. For example, the substrate 52 may include an epitaxial layer overlying a bulk semiconductor.

The FinFET device structure 10 also includes one or more fin structures 54 (e.g., Si fins) that extend from the substrate 52 in the Z-direction and surrounded by spacers 55 in the Y-direction. The fin structures 54 are elongated in the X-direction and may optionally include germanium (Ge). The fin structure 54 may be formed by using suitable processes such as photolithography and etching processes. In some embodiments, the fin structure 54 is etched from the substrate 52 using dry etch or plasma processes. In some other embodiments, the fin structure 54 can be formed by a double-patterning lithography (DPL) process. DPL is a method of constructing a pattern on a substrate by dividing the pattern into two interleaved patterns. DPL allows enhanced feature (e.g., fin) density. The fin structure 54 also includes an epi-grown material 12, which may (along with portions of the fin structure 54) serve as the source/drain of the FinFET device structure 10.

An isolation structure 58, such as a shallow trench isolation (STI) structure, is formed to surround the fin structure 54. In some embodiments, a lower portion of the fin structure 54 is surrounded by the isolation structure 58, and an upper portion of the fin structure 54 protrudes from the isolation structure 58, as shown in FIG. 1. In other words, a portion of the fin structure 54 is embedded in the isolation structure 58. The isolation structure 58 prevents electrical interference or crosstalk.

The FinFET device structure 10 further includes a gate stack structure including a gate electrode 60 and a gate dielectric layer (not shown) below the gate electrode 60. The gate electrode 60 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 60 may be formed in a gate last process (or gate replacement process). Hard mask layers 62 and 64 may be used to define the gate electrode 60. A dielectric layer 65 may also be formed on the sidewalls of the gate electrode 60 and over the hard mask layers 62 and 64.

The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack structure includes additional layers, such as interfacial layers, capping layers, diffusion/barrier layers, or other applicable layers. In some embodiments, the gate stack structure is formed over a central portion of the fin structure 54. In some other embodiments, multiple gate stack structures are formed over the fin structure 54. In some other embodiments, the gate stack structure includes a dummy gate stack and is replaced later by a metal gate (MG) after high thermal budget processes are performed.

The gate stack structure is formed by a deposition process, a photolithography process and an etching process. The deposition process includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, FinFET fabrication may still have challenges. For example, loading may become an issue in processes such as etching, where devices having substantially different sizes may have different etching performances. In the formation of metal gate electrodes, conventional processes may form a bulk tungsten material with a wide lateral dimension (e.g., long channel devices) as a part of the metal gate electrode. This could cause loading issues and may lead to excessive loss of gate height, particularly if other smaller devices (e.g., short channel devices) are present. In addition, conventional processes had to etch a work function metal and the bulk tungsten separately, which adds to the fabrication process complexity and cost.

To reduce the excessive loss of the gate height and to improve loading, the present disclosure utilizes unique fabrication process flows, which allows the metal gate electrode materials to be etched to not have substantially different dimensions from one another. Furthermore, the present disclosure allows the work function metal and the metal material (e.g., tungsten) formed above the work function metal to be etched together, which reduces process complexity and cost. The present disclosure also forms T-shape helmets having a high-k dielectric material above gate spacers. During the formation of source/drain contacts, a contact hole etching process is supposed to etch an interlayer dielectric (ILD) material adjacent to the gate spacers to form the contact holes. However, due to the similarity in material compositions between the ILD and the gate spacers, the gate spacers could be inadvertently etched, particularly for short channel devices where an overlay shift may exacerbate this problem. Here, the high-k dielectric material composition of the T-shaped helmet is more resistant to etching and therefore protects the gate spacers underneath from being inadvertently etched during the contact hole formation.

The various aspects of the present disclosure will now be discussed below in more detail with reference to FIGS. 2A-33A, 2B-33B, 2C-33C, 2D-33D and 34 below. In that regard, FIGS. 2A-33A illustrate fragmentary cross-sectional side views of a portion of a FinFET device 100A at various stages of fabrication, FIGS. 2B-33B illustrate fragmentary cross-sectional side views of a portion of a FinFET device 100B at various stages of fabrication, FIGS. 2C-33C illustrate fragmentary cross-sectional side views of a portion of a FinFET device 100C at various stages of fabrication, and FIGS. 2D-33D illustrate fragmentary cross-sectional side views of a portion of a FinFET device 100D at various stages of fabrication. It is understood that the cross-sectional views of FIGS. 2A-33A, 2B-33B, 2C-33C, and 2D-33D correspond to the cross-sectional views taken in the X-direction shown in FIG. 1, and as such they may be referred to as X-cuts.

The FinFET devices 100A, 100B, 100C, and 100D may be devices on the same wafer but may have different sizes, for example different gate lengths (Lag). In the illustrated embodiment, the FinFET device 100A has the smallest gate length (e.g., physical Lg in a range between about 8 nm and about 20 nm), the FinFET device 100B has a gate length (e.g., Lg in a range between about 20 nm and about 44 nm) larger than the gate length of the FinFET device 100A, the FinFET device 100C has a gate length (e.g., physical Lg in a range between about 44 nm and about 72 nm) larger than the gate length of the FinFET device 100B, and the FinFET device 100D has the largest gate length (e.g., physical Lg in a range between about 72 nm and about 240 nm). The FinFET device 100A may be referred to as a short channel (SC) device. The FinFET devices 100B and 100C may each be referred to as middle channel (SC) device. The FinFET device 100D may be referred to as a long channel (LC) device.

Due to their differences in size, the FinFET device 100A, 100B, 100C, and 100D may have different applications or may be used differently on an IC. As a non-limiting example, the short channel FinFET device 100A may be suitable for "core" devices, which may include logic devices (that do not need to handle the input/output voltages/currents directly), such as the various logic gates such as NAND, NOR, INVERTER, etc. In some embodiments, the core devices may include transistors of a static random-access memory (SRAM) device. In comparison, the long channel FinFET device 100D may include, as non-limiting examples, input/output (I/O) devices that are configured to handle the input and/or output voltages/currents, and as such they need to be able to tolerate a greater amount of voltage or current swing than non-I/O devices. The middle channel FinFET devices 100B and 100C may be used for other suitable IC applications.

Referring now to FIGS. 2A, 2B, 2C, and 2D, the FinFET devices 100A, 100B, 100C, and 100D include fin structures 110A, 110B, 110C, and 110D, respectively. The fin structures 110A, 110B, 110C, and 110D may each be similar to the fin structure 104 discussed above with reference to FIG. 1. The fin structures 110A, 110B, 110C, and 110D may include a semiconductor material such as silicon or silicon germanium. In some embodiments, the fin structures 110A-110D may serve as channel regions of transistors.

The FinFET devices 100A, 100B, 100C, and 100D also include source/drain regions 120A, 120B, 120C, and 120D, respectively. The source/drain regions 120A, 120B, 120C, and 120D may each include a dopant, for example boron, arsenic, phosphorous, etc., depending on whether the respective FinFET device is a P-type transistor or an N-type transistor. In some embodiments, the gate length Lg of the respective FinFET device 100A, 100B, 100C, and 100D roughly correspond to distances 125A, 125B, 125C, and 125D between the two adjacent source/drain regions for the FinFET devices 100A, 100B, 100C, and 100D, respectively.

As such, the FinFET device 100A has the most closely located source/drain regions 120A (e.g., 125A being the smallest), the FinFET device 100B has source/drain regions 120B that are farther apart (e.g., 125B>125A), the FinFET device 100C has source/drain regions 120C that are even farther apart (e.g., 125C>125B>125A), and the FinFET device 100D has the most spaced-apart source/drain regions 120D (e.g., 125D>125C>125B>125A).

The FinFET devices 100A, 100B, 100C, and 100D include interlayer dielectric (ILD) layers 130A, 130B, 130C, and 130D, respectively. The ILD layers 130A, 130B, 130C, and 130D may each be a bottommost ILD layer and may be referred to as ILD0 layers. The ILD layers 130A, 130B, 130C, and 130D each include a dielectric material, for example a low-k dielectric material (e.g., a dielectric material having a smaller dielectric constant than silicon oxide) in some embodiments, or silicon oxide in some other embodiments. The ILD layers 130A, 130B, 130C, and 130D are disposed over, and vertically aligned with, the source/drain regions 120A, 120B, 120C, and 120D, respectively.

The FinFET devices 100A, 100B, 100C, and 100D include work function metal layers 140A, 140B, 140C, and 140D, respectively. The work functional metal layers 140A, 140B, 140C, and 140D are configured to tune a work function of their corresponding FinFET device to achieve a desired threshold voltage Vt. In various embodiments, the work function metal layers 140A, 140B, 140C, and 140D may contain: TiN, TaN, TiAl, TiAlN, or TaCN, or combinations thereof. The work function metal layers 140A, 140B, 140C, and 140D are disposed over, and vertically aligned with, the fin structures 110A, 110B, 110C, and 110D, respectively.

The FinFET devices 100A, 100B, 100C, and 100D include spacers 150A, 150B, 150C, and 150D, respectively. The spacers 150A are disposed between the ILD layer 130A and the work function metal layers 140A. The spacers 150B are disposed between the ILD layer 130B and the work function metal layer 140B. The spacers 150C are disposed between the ILD layer 130C and the work function metal layers 140C. The spacers 150D are disposed between the ILD layer 130D and the work function metal layers 140D. The spacers 150A, 150B, 150C, and 150D include a dielectric material, for example, a low-k dielectric material in some embodiments, or silicon nitride ($SiN_x$), silicon carbon nitride (SiCN), silicon oxynitride (SiON), silicon oxycarbide nitride (SIOCN), or combinations thereof in other embodiments. The spacers 150A, 150B, 150C, and 150C may each be formed by a deposition process followed by one or more etching and polishing processes. If not sufficiently protected, the spacer 150A may become inadvertently damaged during source/drain contact hole etching processes performed later. According to the various aspects of the present disclosure, a T-shaped helmet may be formed to protect the spacers 150A from etching damages, as discussed below in more detail.

The FinFET devices 100A, 100B, 100C, and 100D include metal layers 160A, 160B, 160C, and 160D, respectively. The metal layers 160A, 160B, 160C, and 160D are formed over the work function metal layers 140A, 140B, 140C, and 140D, respectively. The work function metal layers 140A, 140B, 140C, 140D and the metal layers 160A, 160B, 160C, and 160D collectively form the gate electrodes of the FinFET devices 100A, 100B, 100C, and 100D, respectively. In some embodiments, the metal layers 160A, 160B, 160C, and 160D include tungsten (W). In some embodiments, the metal layers 160A, 160B, 160C, and 160D are formed by atomic layer deposition (ALD). In some embodiments, the metal layers 160A, 160B, 160C, and 160D may have a thickness that is in a range between about 30 angstroms and about 150 angstroms. Compared to conventional processes where a bulk tungsten is formed (with a much greater thickness), the thickness of the metal layers 160A-160D is substantially smaller, which makes it easier to etch in later processes, as well as reducing etching loading concerns.

The FinFET devices 100A, 100B, 100C, and 100D have gate heights 170A, 170B, 170C, and 170D, respectively. The gate heights 170A, 170B, 170C, and 170D may approximately correspond to the vertical dimensions of the spacers 150A, 150B, 150C, and 150D, respectively. In some embodiments, the gate heights 170A, 170B, 170C, and 170D may be in a range between about 60 nm and about 120 nm.

As shown in FIGS. 2A-2D, the size differences (e.g., different gate lengths Lg) between the FinFET devices 100A, 100B, 100C, and 100D lead to the different shapes or cross-sectional profiles between the work function metal layers 140A, 140B, 140C, 140D, as well as different shapes or cross-sectional profiles between the metal layers 160A, 160B, 160C, 160D. For example, since the FinFET device 100A has the shortest gate length, the portions of the work function metal layer 140A disposed on sidewalls of the spacers 150A merge together, while an upper portion of the work function metal layer 140A is disposed above the ILD layer 130A and the spacers 150A.

In comparison, the FinFET device 100B has a longer gate length than the FinFET device 100A, and thus the portions of the work function metal layer 140B disposed on sidewalls of the spacers 150B do not merge together, but rather define an opening. This opening is then filled by a portion of the metal layer 160B.

For the FinFET device 100C, it has an even longer gate length than the FinFET device 100B. Similar to the FinFET device 100B, the portions of the work function metal layer 140C disposed on sidewalls of the spacers 150C do not merge together but define an opening, which is partially filled by the metal layer 160C. However, due to the longer gate length of the FinFET device 100C, the opening defined by the work function metal layer 140C is sufficiently wide, such that the metal layer 160C does not completely fill it. Instead, the portions of the metal layer 160C disposed on the sidewalls of the work function metal layer 140C define an opening 180C.

Meanwhile, the FinFET device 100D has the longest gate length, and similar to the FinFET device 100C, the FinFET device 100D also has an opening 180D defined by the portions of the metal layer 160D that are disposed on the sidewalls of the work function metal layer 140D. Alternatively stated, the metal layers 140D and 160 partially, but do not completely, fill the opening defined by the sidewalls of the spacers 150D and the upper surface of the fin structure 110D, and by doing so, the metal layer 160D defines the opening 180D.

Referring now to FIGS. 3A-3D, dielectric layers 210A, 210B, 210C, and 210D are formed over the metal layers 160A, 160B, 160C, and 160D, respectively. The dielectric layers 210A-210D may be formed by a suitable deposition process, for example by ALD. In some embodiments, the dielectric layers 210A-210D include silicon nitride. In other embodiments, the dielectric layers 210A-210D may include silicon oxide. Note that for FinFET devices 100C and 100D, the dielectric layer 210C and 210D fill the openings 180C and 180D, respectively. Thereafter, dielectric layers dielectric layers 220A, 220B, 220C, and 220D are formed over the dielectric layers 210A, 210B, 210C, and 210D, respectively.

The dielectric layers 220A-220D may also be formed by one or more suitable deposition processes. For example, the dielectric layers 220A-220D may be formed by ALD, or plasma enhanced chemical vapor deposition (PECVD), or a combination of ALD and PECVD (e.g., a lower portion being formed by ALD, and an upper portion being formed by PECVD).

The dielectric layers 220A-220D may contain different materials than the dielectric layers 210A-210D. For example, in embodiments where the dielectric layers 210A-210D contain silicon nitride, the dielectric layers 220A-220D may contain silicon oxide, or vice versa. In other alternative embodiments, the dielectric layers 210A-210D and the dielectric layers 220A-220D may include the same type of materials. Note that in the case of FinFET device 100D, the dielectric layer 210D and the dielectric layer 220D collectively fill the opening 180D.

Referring now to FIGS. 4A-4D, a planarization process such as a chemical mechanical polishing (CMP) process is performed to the FinFET devices 100A-100D. The planarization process removes portions of the dielectric layers 210A-210D and 220A-220D, as well as portions of the metal layers 160A-160D, until the work function metal layers 140A-140D are reached. In other words, the work function metal layers 140A-140D serve as polishing-stop layers for the planarization process.

Referring now to FIGS. 5A-5D, a dielectric layer 230A is formed over the work function metal layer 140A for the FinFET device 100A. Thereafter, one or more etching processes 235 may be performed to the FinFET devices 100B-100D. The dielectric layer 230A serves as an etching mask during the one or more etching processes 235 and protects the FinFET device 100A from being etched. Meanwhile, the one or more etching processes 235 etch away portions of the metal layers 160B-160D and portions of the work function metal layers 140B-140D. In some embodiments, the one or more etching processes 235 may use one or more of the following materials as etchants: $BCl_3$, $Cl_2$, $CF_4$, $NF_3$, $HBr/NF_3$, $Cl_2/O_2/N_2/NF_3$, $CHF_3/H_2/Ar$, or combinations thereof.

As a result of the one or more etching processes 235, openings 240B, 240C, and 240D are formed in the FinFET devices 100B, 100C, and 100D, respectively. For the FinFET device 100B, the opening 240B exposes a remaining portion of the work function metal layer 140B and a remaining portion of the metal layer 160B. For the FinFET device 100C, the opening 240C exposes a remaining portion of the work function metal layer 140C and a remaining portion of the metal layer 160C. For the FinFET device 100D, the opening 240D exposes a remaining portion of the work function metal layer 140D and a remaining portion of the metal layer 160D. The dielectric layer 210C remains in the FinFET device 100C, and the dielectric layers 210D and 220D remain in the FinFET device 100D. It may be said that the openings 240B, 240C and 240D each have a U-shaped cross-sectional profile, as defined by the upper surfaces of the work function metal layers 140B & 160B, 140C &160C, 140D & 160D and the side surfaces of the dielectric layers 210C/210D and the spacers 150B, 150C, 150D, respectively. The U-shaped cross-sectional profile is another unique characteristic of the present disclosure.

The openings 240B, 240C, and 240D have lateral dimensions 245B, 245C, and 245D, respectively, which are not too different from one another. For example, the lateral dimension 245B is in a range between about 20 nm and about 42 nm, the lateral dimension 245C is in a range between about 10 nm and about 25 nm, and the lateral dimension 245D is in a range between about 10 nm and about 25 nm. In some embodiments, a ratio between the largest one of the lateral dimensions 245B/245C/245D and the smallest one of the lateral dimensions 245B/245C/245D is in a range from about 2:1 and about 1:1.

Due to the similarity between the lateral dimensions 245B-245D, the lateral dimensions for the metal layers 160B-160D and 140B-140D that are etched by the etching processes 235 are not too different from one another either. This reduces etching loading problems. For example, if bulk metal layers had been formed for the FinFET devices 100B, 100C and 100D, then the bulk metal layers would have substantially different lateral dimensions (e.g., FinFET device 100D having the largest bulk metal layer, and the FinFET device 100B having the smallest metal layer). As a result, the etching of the differently-sized metal layers would have had substantially different loading, which could lead to lack of uniformity.

Here, the formation of the thin metal layers 160B-160D allows dielectric layers 210C-210D and 220D to be formed, and the lateral dimensions of the metal layers 160B-160D that need to be etched are defined by the sizes 245B-245D of the openings 240B-240D, respectively. Since there is not a big difference between the lateral dimensions 245B-245D, the etching loading concerns are greatly reduced when the metal layers 160B-160D are etched. In addition, the present disclosure allows the work function metal layers 140B-140D and the metal layers 160B-160D to be etched simultaneously during the etching processes 235, rather than separately. This reduces fabrication process complexity and cost.

Referring now to FIGS. 6A-6D, dielectric layers 250A, 250B, 250C, and 250D are formed for the FinFET devices 100A, 100B, 100C, and 100D, respectively. The dielectric layer 250A is formed over the dielectric layer 250A. The dielectric layer 250B is formed over the ILD 130B, the spacers 150B, the work function metal layer 140B, and the metal layer 160B, and fills the opening 240B. The dielectric layer 250C is formed over the ILD 130C, the spacers 150C, the work function metal layer 140C, the metal layer 160C, and the dielectric layer 210C, and fills the opening 240C. The dielectric layer 250D is formed over the ILD 130D, the spacers 150D, the work function metal layer 140D, the metal layer 160D, and the dielectric layers 210D-220D, and fills the opening 240D. The dielectric layers 250A-250D are formed by a suitable deposition process such as an ALD process. In some embodiments, the dielectric layers 250A-250D include silicon nitride.

Referring now to FIGS. 7A-7D, a planarization process such as a chemical mechanical polishing (CMP) process is performed to the FinFET devices 100A-100D. The planarization process removes portions of the dielectric layers 250A-250D and the upper portions of the spacers 150A-150D, as well as the dielectric layer 230A and portions of the work function metal layer 140A of FinFET device 100A, until the ILD layers 130A-130D are reached. In other words, the ILD layers 130A-130D serve as polishing-stop layers for the planarization process. As a result of the planarization process, the FinFET devices 100A, 100B, 100C, and 100D now have reduced gate heights 270A, 270B, 270C, and 270D, respectively. The gate heights 270A, 270B, 270C, and 270D may approximately correspond to the vertical dimensions of the ILD layers 130A, 130B, 130C, and 130D, respectively. In some embodiments, the gate heights 270A, 270B, 270C, and 270D may be in a range between about 45 nm and about 89 nm.

Referring now to FIGS. 8A-8D, one or more etching processes 300 may be performed to the FinFET devices 100A-100D. The one or more etching processes 300 remove portions of the ILD 130A, 130B, 130C, and 130D to form recesses 310A, 310B, 310C, and 310D in the FinFET devices 100A, 100B, 100C, and 100D. The recesses 310A, 310B, 310C, and 310D are etched to have vertical dimensions 320A, 320B, 320C, and 320D, respectively, which each correspond to a distance from the top surface of the respective ILD layer 130A/B/C/D to a top surface of the respective work function metal layer 140A/B/C/D. In some embodiments, the vertical dimensions 320A, 320B, 320C, and 320D are in a range between about 15 nm and about 30 nm.

Referring now to FIGS. 9A-9D, dielectric layers 330A, 330B, 330C, and 330D are formed to fill the recesses 310A, 310B, 310C, and 310D, respectively. The dielectric layers 330A, 330B, 330C, and 330D are formed over the ILD layers 130A, 130B, 130C, and 130D, respectively. The dielectric layers 330A-330D may be formed using a suitable deposition process, such as ALD, CVD, etc. In some embodiments, the dielectric layers 330A-330D may include yttrium silicon oxide ($YSiO_x$). In other embodiments, the dielectric layers 330A-330D may include silicon nitride (SiN), silicon oxy-carbide (SiOC), silicon carbon nitride (SiCN), or silicon oxy-carbon nitride (SiOCN). Following the deposition of the dielectric layers 330A-330D, a planarization process such as a CMP process may be performed to polish the surface of the dielectric layers 330A-330D, until the upper surface of the dielectric layer 330A is coplanar with the upper surface of the work function metal layers 140A, and the upper surfaces of the dielectric layers 330B-330D are coplanar with the upper surfaces of the dielectric layers 250B-250D, respectively. The dielectric layers 330A-330D have vertical dimensions 340A-340D, respectively. Due to the planarization process removing some portions of the work function metal layer 140A and the dielectric layers 250B-250D, the vertical dimensions 340A-340D are smaller than the vertical dimensions 320A-320D. In some embodiments, the vertical dimensions 340A-340D are in a range between about 15 nm and about 21 nm. It is understood that the processes discussed with reference to FIGS. 8A-8D and 9A-9D may be optional processes. In other words, they may be performed in some embodiments but may be omitted in other embodiments, in which case the processes associated with FIGS. 10A-10D (discussed below) may be performed after the processes of FIGS. 7A-7D are performed.

Referring now to FIGS. 10A-10D, one or more etching processes 350 are performed to the FinFET devices 100A-100D. The one or more etching processes 350 form T-shaped recesses 360A in the FinFET device 100A by removing portions of the work function metal layer 140A and the spacers 150A. For example, in some embodiments, the one or more etching processes 350 may first perform a first etch-back process on the gate metal in which the work function metal layer 140A is etched away without substantially etching the spacers 150A. A spacer pull-back process is then performed to remove portions of the spacers 150A above the work function metal layer 140A. Thus, the first etching-back process and the spacer pull-back process effectively define a height of the spacers 150A. Thereafter, a second etch-back process is performed to selectively remove the work functional metal layer 140A again without substantially etching the spacers 150A. The second etch-back process effectively defines the height of the (now-shorter) work function metal layer 140A. In other embodiments, the one or more etching processes 350 may include an etching process in which an etching selectivity exists between the spacers 150A and the work function metal layer 140A, such that the work function metal layer 140A is etched away at a faster rate while the spacers 150A are etched away at a slower rate. Regardless, the end result is that, after the one or more etching process 350 are performed, the spacers 150A are taller than the work function metal layers 140A. As a result, the recesses 360A now have a T-shaped profile in the cross-sectional view of FIG. 10A. The one or more etching processes also etch away portions of the dielectric layers 330A-330D. As a result, the FinFET devices 100A-100D now have reduced heights 370A-370D, respectively. In some embodiments, the heights 370A-370D are in a range between about 37 nm to about 74 nm.

Referring now to FIGS. 11A-11D, metal layers 380A are formed over the work function metal layers 140A for the FinFET device 100A. In some embodiments, the metal layers 380A may include the same material as the metal layers 160B-160D, for example they may all include tungsten. The metal layers 380A and the work function metal layers 140A collectively form the gate electrodes of the FinFET device 100A. The metal layers 160B-160D and the work function metal layers 140B-140D collectively form the gate electrodes of the FinFET devices 100B, 100C, and 100D, respectively.

Referring now to FIGS. 12A-12D, dielectric layers 400A, 400B, 400C, and 400D are formed for the FinFET devices 100A, 100B, 100C, and 100D, respectively. The dielectric layers 400A are formed over the dielectric layers 330A, the spacers 150A, and the metal layers 380A and fill the T-shaped recesses 360A. The dielectric layers 400B-400D are formed over the dielectric layers 330B-330D, the spacers 150B-150D, and the dielectric layers 250B-250D. The dielectric layers 400A-400D may include a high-k dielectric material (e.g., a dielectric material having a dielectric constant greater than the dielectric constant of silicon dioxide). In some embodiments, the dielectric layers 400A-400D may include zirconium oxide (Sox). In other embodiments, the dielectric layers 400A-400D may include yttrium silicon oxide (YSiO$_x$), silicon oxy-carbide (SiOC), or another suitable high-k dielectric material.

It is understood that other processes may be performed after the stage of fabrication shown in FIGS. 12A-12D. For example, a cut-metal-gate (CMG) may be formed, the details of which are discussed in U.S. patent application Ser. No. 16/021,344, filed on Jun. 28, 2018, and entitled "Method And Device For Forming Cut-Metal-Gate Feature", the content of which is incorporated herein for its entirety. For reasons of simplicity, these other processes are not discussed in detail herein.

Referring now to FIGS. 13A-13D, a planarization process such as a chemical mechanical polishing (CMP) process is performed to the FinFET devices 100A-100D. The planarization process removes portions of the dielectric layers 400A-400D and portions of the dielectric layers 330B-330D. The planarization process is performed until the ILD layers 130A-130D are reached. In other words, the ILD layers 130A-130D serve as polishing-stop layers for the planarization process. At the end of the planarization process, the upper surfaces of the dielectric layers 400A are substantially co-planar with the upper surfaces of the ILD layers 130A. The FinFET devices 100A-100D also have reduced heights 410A-410D, respectively. In some embodiments, the reduced heights 410A-410D are in a range between about 54 nm and about 64 nm.

As shown in FIG. 13A, the dielectric layers 400A each have a T-shaped cross-sectional profile, since they inherit the cross-sectional profiles of the T-shaped recesses 360A. The dielectric layers 400A also serve as "helmets" for the spacers 150A and the gate electrode (e.g., the metal layers 380A and 140A) below during later etching processes. As such, the dielectric layers 400A may also be referred to as T-shaped helmets 400A. Each T-shaped helmet 400A has an upper portion 400A-U and a lower portion 400A-L that is disposed below and narrower than the upper portion. The upper surface of the upper portion 400A-U is coplanar with the upper surfaces of the ILD layers 130A. The side surfaces of the upper portion are in contact with the side surfaces of the ILD layers 130A. The bottom surfaces of the upper portion 400A-U are in contact with the upper surfaces of the spacers 150A. The side surfaces of the lower portion 400A-L are in contact with the side surfaces of the spacers 150A. The bottom surfaces of the lower portion 400A-L are in contact with the metal layers 380A. The T-shaped helmets 400A are one of the unique physical characteristics of the present application.

One of the advantages of the process flow discussed above is that it reduces loss of gate height. Starting with a gate height of 170A-170D shown in FIGS. 2A-2D (e.g., in a range between about 60 nm and about 120 nm), the FinFET devices 100A-100D end up with a gate height of 410A-410D shown in FIGS. 13A-13D (e.g., in a range between about 54 nm and about 64 nm). The loss of gate height is small compared to conventional processes. Another advantage is that the present disclosure reduces loading, for example loading in etching processes. For example, conventional processes may require a bulk tungsten to be formed and then etched as a part of the gate electrode formation, which leads to loading problems, particularly for devices having a big difference in sizes such as the short channel, middle channel, and long channel devices discussed above. In comparison, the present disclosure does not form a bulk tungsten but rather a thin layer of metal such as the metal layer 160D (e.g., tungsten), as discussed above with reference to FIGS. 2A-2D. Furthermore, the flow of the present disclosure results in similar lateral dimensions of the metal layer 140B/160B-140D/160D, which allows the metal layers 140B/160B-140D/160D to be easily etched without causing loading, as discussed above with reference to FIGS. 5A-5D. The resulting U-shape cross-sectional profile of the openings 240B, 240C and 240D is another unique characteristic of the present disclosure.

Additional fabrication processes may be performed to finish the fabrication of FinFET devices 100A-100D. For example, referring now to FIGS. 14A-14D, source/drain contacts 440A, 440B, 440C, and 440D may be formed for the FinFET devices 100A, 100B, 100C, and 100D, respectively. The source/drain contacts 440A-440D are formed over, and provide electrical connectivity to the source/drain regions 120A-120D. The source/drain contacts 440A-440D may include an electrically conductive material such as metal or metal compound. The T-shaped helmets 400A serve as hard masks—to protect the spacers 150A and/or the gate electrode therebelow—when contact holes are etched in the formation of the source/drain contacts 440A-440D. Due to the high-k material composition of the T-shaped helmets 400A, they may be more resistant to etching and therefore function well as etching hard masks. This is beneficial for the FinFET device 100A, since its small size means that it may be prone to overlay issues. When overlay shifts occur, the contact hole etching processes may expose the spacers 150A and possibly the gate electrode (e.g., metal layers 140A and 380A) to the etching, if the T-shaped helmet 400A had not been formed. Here, the T-shaped helmet 400A will protect the spacers 150A and the gate electrode from being etched, which is another advantage of the present disclosure.

Dielectric layers 450A, 450B, 450C, and 450D are disposed above the source/drain contacts 440A, 440B, 440C, 440D, respectively. The dielectric layers 450A-450D may have the same material composition as the dielectric layers 250B-250D, for example silicon nitride. ILD layers 460A, 460B, 460C, and 460D are formed over the dielectric layers 450A, 450B, 450C, and 450D, respectively. It is understood that the high-k material composition of the T-shaped helmets 400A is merely an example and is not intended to be limiting. In other embodiments, other types of dielectric materials may be used to implement the T-shaped helmets, as long as a sufficiently high etching selectivity exists between the T-shaped helmets and the ILD0 layer during the contact hole etching process. It is understood that in some embodiments, following the contact hole etching process, the high-k materials of the T-shaped helmets 400A may be replaced by a low-k dielectric material (e.g., dielectric constant lower than about 4). Thus, the T-shaped helmets 400A in these embodiments may have a low-k dielectric material composition, rather than a high-k dielectric material composition.

FIGS. 2A-2D to 14A-14D pertain to a first embodiment of the present disclosure. A second embodiment of the present disclosure is discussed below with reference to FIGS. 15A-15D to 22A-22D. For reasons of simplicity and consistency, similar components in both the first and second embodiments are labeled the same.

Referring now to FIGS. 15A-15D, the FinFET devices 100A-100D are in a similar stage of fabrication as the stage shown in FIGS. 2A-2D. For example, work function metal layers 140A-140D are formed over the fin structures 110A-110D. Metal layers 160A-160D are formed over the work function metal layers 140A-140D. As discussed above, for the middle channel FinFET device 100C and the long channel FinFET device 100D, the work function metal layers 140C/140D and the metal layers 160C/160D do not completely fill the openings 180C and 180D. Unlike the first embodiment, however, the dielectric layers 330A-330D are formed over the ILD layers 130A-130D, respectively. As discussed above, the dielectric layers 330A-330D may have different material compositions from the ILD layers 130A-130D. In some embodiments, the dielectric layers 330A-330D may include YSiO$_x$, SiN, SiOC, SiCN, or SiOCN.

Referring now to FIGS. 16A-16D, the dielectric layer 210C is formed to fill the opening 180C for the FinFET device 100C, and the dielectric layers 210D and 220D are formed to fill the opening 180D for the FinFET device 100D. As discussed above with reference to FIGS. 3A-3D and 4A-4D, the dielectric layers 210C/210D and 220D are formed by deposition processes followed by a planarization process.

Referring now to FIGS. 17A-17D, the dielectric layer 230A is formed over the FinFET device 100A (as a mask layer). Etching processes 235 are then performed (while the dielectric layer 230A protects the FinFET device 100A underneath) to partially etch away the metal layers 160B-160D and the work function metal layers 140B-140D of the FinFET devices 100B/100C/100D. As a result of the etching processes 235, the openings 240B, 240C, and 240D are formed, which may be said to have "U-shaped" cross-sectional profiles. The lateral dimensions 245B, 245C, and 245D of the openings 240B, 240C, and 240D are not too substantially different from one another, and thus the etching load concerns are substantially reduced.

Referring now to FIGS. 18A-18D, the dielectric layers 250B-250D are formed to fill the openings 240B-240D, respectively. A planarization process is then performed to planarize the upper surfaces of the dielectric layers 250B-250D. The planarization process removes the dielectric layer 230A, as well as portions of the work function metal layer 140A disposed over the dielectric layers 330A. After the planarization process, the upper surfaces of the dielectric layers 250B-250D are substantially coplanar with the upper surfaces of the 330B-330D.

Referring now to FIGS. 19A-19D, the T-shaped recess 360A is etched in the FinFET device 100A. The sidewalls of the T-shaped recess 360A are collectively defined by the side surfaces of the ILD layers 130A and the side surfaces of the dielectric layers 330A. The metal layer 380A is then formed over the work function metal layer 140A in the T-shaped recess 360A.

Referring now to FIGS. 20A-20D, the dielectric layers 400A-400D are formed for the FinFET devices 100A-100D. The dielectric layers 400A-400D may include a high-k material such as zirconium oxide (and/or other materials). The dielectric layer 400A fills the T-shaped recess 360A.

Referring now to FIGS. 21A-21D, dielectric layers 420A, 420B, 420C, and 420D are formed over the dielectric layers 400A, 400B, 400C, and 400D, respectively. In some embodiments, the dielectric layers 420A-420D and the dielectric layers 210C-210D and 250B-250D may have the same material compositions (e.g., silicon nitride). The dielectric layers 420A-420D may serve as a hard mask layer for subsequent etching processes such as the cut-metal-gate (CMG) process discussed in U.S. patent application Ser. No. 16/021,344, filed on Jun. 28, 2018, and entitled "Method And Device For Forming Cut-Metal-Gate Feature", the content of which is incorporated herein for its entirety. For reasons of simplicity, these other etching processes are not discussed in detail herein.

Referring now to FIGS. 22A-22D, a planarization process is performed to remove the dielectric layers 420A-420D and portions of the dielectric layers 400A-400D. The FinFET devices 100A-100D have flat upper surfaces after the planarization process is performed. The remaining portion of the dielectric layer 400A in the FinFET devices 100A forms the T-shaped helmet.

Similar to the first embodiment discussed above in association with FIGS. 2A-2D through 14A-14D, the second embodiment of FIGS. 15A-15D through 22A-22D have substantially similar device structures, though the fabrication processes performed to reach the end structures are slightly different. The second embodiment still offers the same advantages as the first embodiment discussed above.

A third embodiment of the present disclosure is discussed below with reference to FIGS. 23A-23D through FIGS. 28A-28D. Again, for reasons of simplicity and consistency, similar components in the first, second, and third embodiments are labeled the same.

Referring now to FIGS. 23A-23D, the FinFET devices 100A-100D are in a similar stage of fabrication as the stage shown in FIGS. 2A-2D or the stage shown in FIGS. 15A-15D. For example, work function metal layers 140A-140D are formed over the fin structures 110A-110D. The upper portions of the work function metal layers 140A-140D are disposed over the dielectric layers 330A-330D, respectively. Metal layers 160A-160D are formed over the work function metal layers 140A-140D. As discussed above, for the middle channel FinFET device 100C and the long channel FinFET device 100D, the work function metal layers 140C/140D and the metal layers 160C/160D do not completely fill the openings 180C and 180D.

Referring now to FIGS. 24A-24D, the dielectric layer 210C is formed to fill the opening 180C for the FinFET device 100C, and the dielectric layers 210D and 220D are formed to fill the opening 180D for the FinFET device 100D. As discussed above with reference to FIGS. 3A-3D and 4A-4D, the dielectric layers 210C/210D and 220D are formed by deposition processes followed by a planarization process, which is performed until the dielectric layers 330A-330D are exposed.

Referring now to FIGS. 25A-25D, etching processes 235 are performed to partially etch away the metal layers 160A-160D, the work function metal layers 140A-140D, as well as the spacers 150A-150D for all the FinFET devices 100A-100D. Unlike the first and second embodiments, no dielectric layer mask is formed over the FinFET device 100A to protect it from being etched during the etching processes 235. In other words, all FinFET devices 100A-100D are being etched in the third embodiment shown in FIGS. 24A-24D.

As a result of the etching processes 235, openings 240A-240D are formed in the FinFET devices 100A-100D, respectively. The lateral dimensions 245A-245D of their respective openings 240A-240D are not too substantially different from one another, and thus the etching load concerns are substantially reduced. Note that both the FinFET devices 100A-100B have openings 240A-240B that have T-shaped profiles at this point.

Referring now to FIGS. 26A-26D, the dielectric layers 400A-400D are formed for the FinFET devices 100A-100D. The dielectric layers 400A-400D may include a high-k material such as zirconium oxide. The dielectric layers 400A-400D fill the openings 240A-240D, respectively.

Referring now to FIGS. 27A-27D, an etching back process is performed to partially remove the dielectric layers 400A-400D. Thereafter, the dielectric layers 420A-420D are formed over the dielectric layers 400A-400D for the FinFET devices 100A-100D, respectively. In some embodiments, the dielectric layers 420A-420D include silicon nitride. The dielectric layers 420A-420D may serve as a hard mask layer for subsequent etching processes such as the cut-metal-gate (CMG) process discussed in U.S. patent application Ser. No. 16/021,344, filed on Jun. 28, 2018, and entitled "Method And Device For Forming Cut-Metal-Gate Feature", the content of which is incorporated herein for its entirety. For reasons of simplicity, these other etching processes are not discussed in detail herein.

Referring now to FIGS. 28A-28D, a planarization process is performed to remove the dielectric layers 400A-400D as well as the dielectric layers 330A-330D. After the performance of the planarization process, the upper surfaces of the ILD layers 130A-130D are substantially coplanar with the dielectric layers 400A-400D, respectively. At this stage of fabrication, the dielectric layers 400A and 400B each have a T-shaped cross-sectional profile. In Meanwhile, the dielectric layers 400C and 400D have cross-sectional profiles that resemble a rotated "L" or a flipped "L". For example, the dielectric layers 400C and 400D each have an upper portion that is wider than a lower portion. One sidewall surface of the upper portion is in contact with the ILD 130C/130D, while an opposite sidewall surface of the upper portion is in contact with the dielectric layer 210C/210D. One sidewall surface of the lower portion is in contact with the spacer 150C/150D, while an opposite sidewall surface of the lower portion is in contact with the dielectric layer 210C/210D. Again, the T-shaped profiles of the dielectric layers 400A/400B and the rotated/flipped L-shaped profiles of the dielectric layers 400C/400D are unique physical characteristics of the present disclosure, which may serve as evidence that the fabrication processes discussed above have been performed.

As discussed above with the first and second embodiments, additional fabrication processes may be performed to finish the fabrication of FinFET devices 100A-100D for the third embodiment. For example, referring now to FIGS. 29A-29D, source/drain contacts 440A-440D may be formed over, and provide electrical connectivity to, the source/drain regions 120A-120D of the FinFET devices 100A-100D, respectively. Due to their high-k material composition, the dielectric layers 400A-400D serve as hard masks—to protect the spacers gate electrode therebelow—when contact holes are etched in the formation of the source/drain contacts 440A-440D. Dielectric layers 450A-450D are disposed above the source/drain contacts 440A-440D, respectively. The dielectric layers 450A-450D may have the same material composition as the dielectric layers 250B-250D, for example silicon nitride. ILD layers 460A-460D are formed over the dielectric layers 450A-450D, respectively.

It can be seen that the fabrication processes performed according to the first, second, and third embodiments result in a device structure for FinFET device 100A that is substantially the same for all three embodiments—that is, the T-shaped helmet 400A is present for all three embodiments. In comparison, the FinFET devices 100B-100D for the third embodiment end up with high-k dielectric layers 400B-400D, which is not the case for the first and second embodiments. As can be seen from FIGS. 28B-29B, the high-k dielectric layer 400B for the third embodiment also has a T-shaped profile. Meanwhile, as can be seen from FIGS. 28C-28D and 29C-29D, the high-k dielectric layers 400C-400D have rotated or flipped L-shaped profiles.

FIGS. 30A, 30B, 30C, and 30D illustrate FinFET devices 100A, 100B, 100C, and 100D fabricated according to a fourth embodiment of the present disclosure. The fourth embodiment may follow a substantially similar fabrication flow of the third embodiment, with the exception that the dielectric layers 210C, 210D, and 220D are also formed using a high-k dielectric material, for example, the same material as the high-k dielectric layers 400A-400D, such as zirconium oxide, or other high-k materials such as hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof. As a result, the resulting device structure for all four of FinFET devices 100A-100D will have a T-shaped helmet 400A-400D, respectively. However, for FinFET devices 100C-100D, the T-shaped helmets 400C-400D are shaped slightly differently. For example, the T-shaped helmet 400C is composed of the dielectric layers 400C and the dielectric layer 210C sandwiched therebetween. The dielectric layer 210C may have a lower bottom surface (e.g., located further below) than the dielectric layers 400C. In addition, though the dielectric layers 400C and 210C may have the same high-k material composition (e.g., zirconium oxide) in some embodiments, they may have different material compositions in alternative embodiments, where the dielectric layers 400C may contain a first type of high-k dielectric material, while the dielectric layer 210C may contain a second type of high-k dielectric material different from the first type. Likewise, the dielectric layer 210D may have a lower bottom surface than the dielectric layers 400D, and they may have the same or different material compositions in various embodiments.

FIGS. 31A, 31B, 31C, and 31D illustrate FinFET devices 100A, 100B, 100C, and 100D fabricated according to a fifth embodiment of the present disclosure. The fifth embodiment may follow a substantially similar fabrication flow of the first embodiment, with the exception that the FinFET device 100A is fabricated using the same processes as the rest of the FinFET devices 100B-100D. For example, in the etching processes 235 discussed above with reference to FIGS. 5A-5D, no dielectric layer 230A is formed as a mask for the FinFET device 100A. Thereafter, no T-shaped helmets are formed for the FinFET device 100A in this fifth embodiment. In other words, the resulting device structure for the FinFET devices 100B-100D are substantially the same for the first embodiment and the fifth embodiment, while the device structure for the FinFET device 100A is different between the first embodiment and the fifth embodiment, in that the FinFET device 100 in the fifth embodiment does not have the T-shaped helmet.

FIGS. 32A, 32B, 32C, and 32D illustrate FinFET devices 100A, 100B, 100C, and 100D fabricated according to a sixth embodiment of the present disclosure. According to the sixth embodiment, the FinFET device 100A still has the same structure (e.g., having a T-shaped helmet) as the FinFET device 100A fabricated according to the first embodiment. However, the FinFET devices 100B-100D have different structures in the sixth embodiment, as the thicknesses of the metal layers 160B-160D in the sixth embodiment are significantly greater than the metal layers 160B-160D in the first embodiment.

FIGS. 33A, 33B, 33C, and 33D illustrate FinFET devices 100A, 100B, 100C, and 100D fabricated according to a seventh embodiment of the present disclosure. According to the seventh embodiment, the FinFET device 100A still has the same structure (e.g., having a T-shaped helmet) as the FinFET device 100A fabricated according to the first embodiment. However, the FinFET devices 100B-100D have different structures in the seventh embodiment. For example, the thicknesses of the metal layers 160B-160D in the seventh embodiment are significantly greater than the metal layers 160B-160D in the first embodiment. In addition, the dielectric layers 400B-400D for the FinFET devices 100B-100D also have T-shaped profiles in the seventh embodiment. In other words, the seventh embodiment may be viewed as a combination of the first embodiment and the sixth embodiment.

It is understood that for the first through seventh embodiments, gate contacts may be formed for the FinFET devices 100A-100D when appropriate. For example, for circuit applications where a transistor's gate needs electrical connectivity, gate contacts may be formed by etching a gate contact hole through the dielectric materials (e.g., the T-shaped helmet 400A or the dielectric layers 210B-210D or 250B-250D) disposed over the work function metal layers 140A-140B and the metal layers 160A-160B, and then filling the gate contact hole with a metal material. For reasons of simplicity, these additional processes are not discussed in detail herein.

Figure 34:
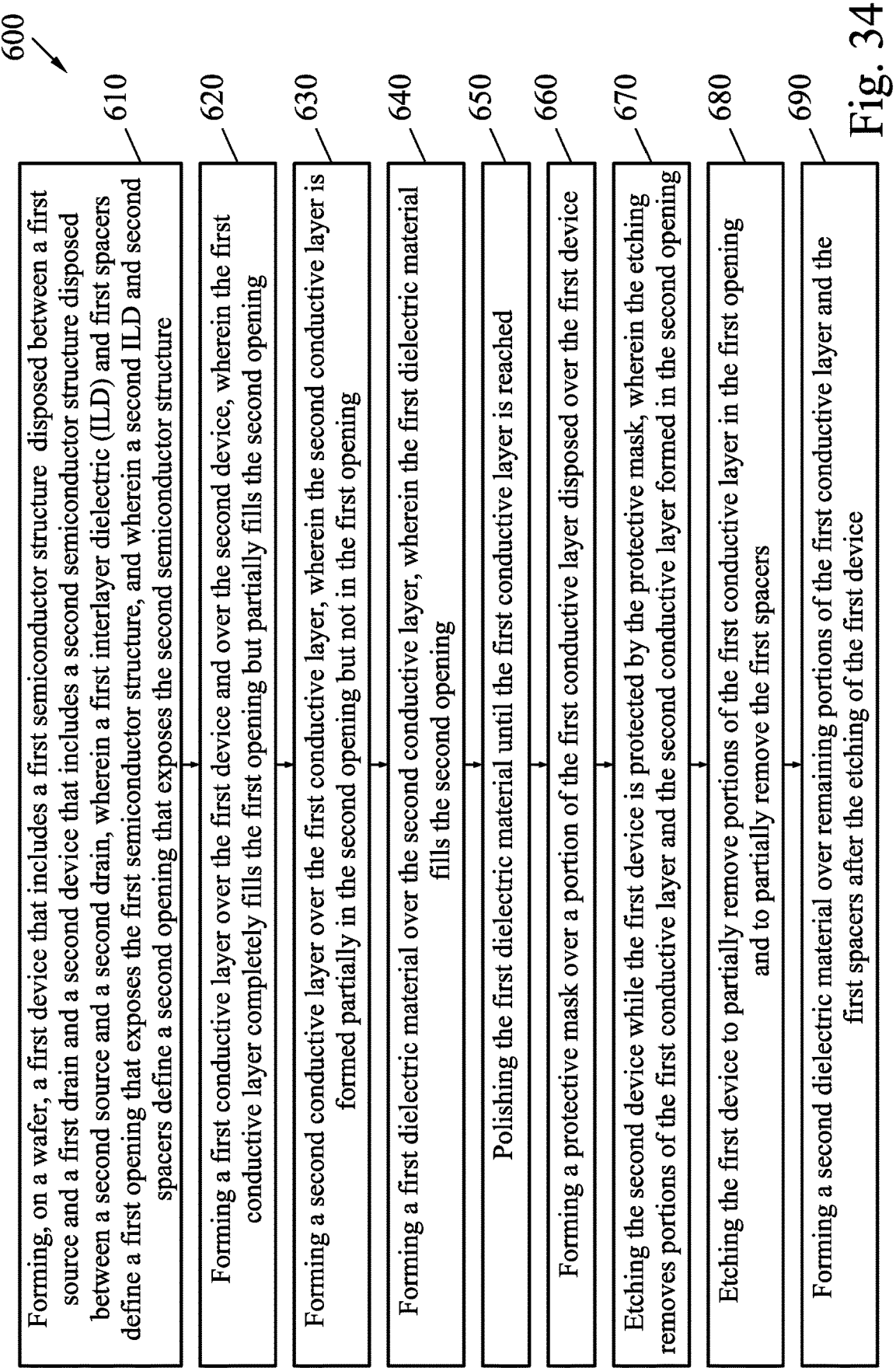
FIG. 34 is a flow chart of a method for fabricating a semiconductor device in accordance with embodiments of the present disclosure.

FIG. 34 is a flowchart of a method 600 for fabricating a semiconductor device in accordance with various aspects of the present disclosure. The method 600 includes a step 610 of forming, on a wafer, a first device that includes a first semiconductor structure disposed between a first source and a first drain and a second device that includes a second semiconductor structure disposed between a second source and a second drain. A first interlayer dielectric (ILD) and first spacers define a first opening that exposes the first semiconductor structure. A second ILD and second spacers define a second opening that exposes the second semiconductor structure. A first distance separating the first source and first drain is less than a second distance separating the second source and the second drain.

The method 600 includes a step 620 of forming a first conductive layer over the first device and over the second device. The first conductive layer completely fills the first opening but partially fills the second opening.

The method 600 includes a step 630 of forming a second conductive layer over the first conductive layer. The second conductive layer is formed partially in the second opening but not in the first opening. The first conductive layer and the second conductive layer have different material compositions.

The method 600 includes a step 640 of forming a first dielectric material over the second conductive layer. The first dielectric material fills the second opening.

The method 600 includes a step 650 of polishing the first dielectric material until the first conductive layer is reached.

The method 600 includes a step 660 of forming a protective mask over a portion of the first conductive layer disposed over the first device.

The method 600 includes a step 670 of etching the second device while the first device is protected by the protective mask. The etching removes portions of the first conductive layer and the second conductive layer formed in the second opening.

The method 600 includes a step 680 of etching the first device to partially remove portions of the first conductive layer in the first opening and to partially remove the first spacers. In some embodiments, the etching of the first device is performed such that an upper surface of the first conductive layer is disposed below upper surfaces of the first spacers after the first device is etched.

The method 600 includes a step 690 of forming a second dielectric material over remaining portions of the first conductive layer and the first spacers after the etching of the first device. In some embodiments, the second dielectric material has a greater dielectric constant than the first dielectric material.

It is understood that additional process steps may be performed before, during, or after the steps 610-690 discussed above to complete the fabrication of the semiconductor device. For example, before the step 610 is performed, the method 600 may include forming dummy gate structures (e.g., a polysilicon gate electrode) and removing the dummy gate structures to form the first opening and the second opening. After the step 690 is performed, the method 600 may include the formation of source/drain contacts of the semiconductor device and/or the formation of vias/metal lines. Other steps may be performed but are not discussed herein in detail for reasons of simplicity.

In summary, the present disclosure utilizes various embodiments each having unique fabrication process flows to form T-shaped helmets with high-k dielectric materials over the gate spacers and gate electrodes. The present disclosure also forms similarly-sized (laterally) U-shaped openings for short channel, middle channel, and long channel devices. Through these U-shaped openings, layers of a metal gate electrode can be etched, for example simultaneously. Based on the above discussions, it can be seen that the present disclosure offers advantages over conventional semiconductor devices and the fabrication thereof. It is understood, however, that other embodiments may offer additional advantages, and not all advantages are necessarily disclosed herein, and that no particular advantage is required for all embodiments. One advantage is that the present disclosure reduces etching loading concerns. For example, due to the similar lateral dimensions between the U-shaped openings for the short channel, middle channel, and long channel devices, the metal layers of the metal gate electrode for these devices have lateral dimensions that are not too different from one another. This means that they can all be etched simultaneously without causing loading problems. Another advantage is that the T-shaped helmets can protect the spacers and the gate electrodes below from being etched inadvertently during subsequent contact hole etching processes. This is even more beneficial for the short channel device, since it may be more prone to overlay shift issues due to its smaller size. Here, even if there is poor overlay, the high-k dielectric material composition of the T-shaped helmets can adequately protect the spacers (e.g., containing a low-k material) and the metal gate electrode therebelow from being etched. Other advantages include compatibility with existing fabrication process flows, etc.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

One aspect of the present disclosure involves a semiconductor device. The semiconductor device includes a first source component and a first drain component. The semiconductor device includes a first semiconductor structure disposed between the first source component and the first drain component. The semiconductor device includes a first gate electrode disposed over the first semiconductor structure. The semiconductor device includes a first dielectric structure disposed over the first gate electrode. The first dielectric structure has a T-shaped profile in a cross-sectional view.

One aspect of the present disclosure involves a semiconductor device. The semiconductor device includes a first transistor and a second transistor. The first transistor includes: a first source and a first drain separated by a first distance; a first semiconductor structure disposed between the first source and the first drain; a first gate electrode disposed over the first semiconductor structure; and a first dielectric structure disposed over the first gate electrode. The first dielectric structure has a lower portion and an upper portion that is disposed over the lower portion and is wider than the lower portion. The second transistor includes: a second source and a second drain separated by a second distance that is greater than the first distance; a second semiconductor structure disposed between the second source and the second drain; a second gate electrode disposed over the second semiconductor structure; and a second dielectric structure disposed over the second gate electrode. The second dielectric structure and the first dielectric structure have different material compositions.

Another aspect of the present disclosure involves a method of fabricating a semiconductor device. On a wafer, a first device and a second device are formed. The first device includes a first semiconductor structure disposed between a first source and a first drain. The second device includes a second semiconductor structure disposed between a second source and a second drain. A first interlayer dielectric (ILD) and first spacers define a first opening that exposes the first semiconductor structure. A second ILD and second spacers define a second opening that exposes the second semiconductor structure. A first distance separating the first source and first drain is less than a second distance separating the second source and the second drain. A first conductive layer is formed over the first device and over the second device. The first conductive layer completely fills the first opening but partially fills the second opening. A second conductive layer is formed over the first conductive layer. The second conductive layer is formed partially in the second opening but not in the first opening. The first conductive layer and the second conductive layer have different material compositions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first source/drain and a second source/drain;
   a semiconductor structure disposed between the first source/drain and the second source/drain;
   a gate dielectric disposed over the semiconductor structure;
   a metal-containing gate electrode disposed over the gate dielectric, wherein at least a portion of an upper surface of the metal-containing gate electrode is curved;
   a first dielectric structure, wherein a bottom surface of the first dielectric structure is disposed over the upper surface of the metal-containing gate electrode; and
   a second dielectric structure disposed over the metal-containing gate electrode, wherein the second dielectric structure extends through the first dielectric structure vertically.

2. The semiconductor device of claim 1, wherein the first dielectric structure and the second dielectric structure have different material compositions.

3. The semiconductor device of claim 2, wherein:
   the first dielectric structure contains zirconium oxide, yttrium silicon oxide, or silicon oxy-carbide;
   the second dielectric structure contains silicon nitride or silicon oxide.

4. The semiconductor device of claim 1, wherein the first dielectric structure has a cross-sectional profile that resembles a vertically-flipped letter "L".

5. The semiconductor device of claim 1, wherein a bottommost surface of the first dielectric structure is more elevated vertically than a bottommost surface of the second dielectric structure.

6. The semiconductor device of claim 1, further comprising gate spacers disposed around the metal-containing gate electrode laterally, wherein a portion of the gate spacers is in direct physical contact with the first dielectric structure.

7. The semiconductor device of claim 6, wherein the gate spacers have a lower dielectric constant than the first dielectric structure.

8. The semiconductor device of claim 6, wherein:
   the first dielectric structure includes an upper portion and a lower portion;
   a bottom surface of the upper portion of the first dielectric structure is disposed over an upper surface of the portion of the gate spacers; and
   a first side surface of the lower portion of the first dielectric structure is disposed on a sidewall of the portion of the gate spacers.

9. The semiconductor device of claim 8, further comprising an interlayer dielectric (ILD) disposed over the first source/drain, wherein:
- a first side surface of the upper portion of the first dielectric structure is in direct physical contact with the ILD;
- a second side surface of the upper portion of the first dielectric structure is in direct physical contact with the second dielectric structure; and
- a second side surface of the lower portion of the first dielectric structure is in direct physical contact with the second dielectric structure.

10. The semiconductor device of claim 1, wherein the first dielectric structure and the second dielectric structure have substantially co-planar upper surfaces.

11. The semiconductor device of claim 1, wherein the first dielectric structure has more rounded bottom surfaces than the second dielectric structure.

12. The semiconductor device of claim 1, wherein:
- the metal-containing gate electrode includes a work function metal layer and a first metal layer disposed over the work function metal layer;
- the first dielectric structure is in direct contact with the work function metal layer and the first metal layer; and
- the second dielectric structure is in direct contact with the first metal layer but not with the work function metal layer.

13. A semiconductor device, comprising:
- a first source/drain region and a second source/drain region;
- an interlayer dielectric (ILD) disposed over the first source/drain region or over the second source/drain region;
- a semiconductor-containing structure disposed between the first source/drain region and the second source/drain region;
- a gate dielectric layer disposed over the semiconductor-containing structure;
- a metal-containing gate electrode disposed over the gate dielectric layer;
- a gate spacer disposed around the metal-containing gate electrode laterally; and
- a high-k dielectric component disposed over the metal-containing gate electrode;

wherein:
- the high-k dielectric component has: a first side surface, a second side surface opposite the first side surface, a first bottom surface, and a second bottom surface less elevated vertically than the first bottom surface;
- the first side surface is in direct contact with the ILD;
- the second side surface is longer than the first side surface;
- the first bottom surface is in direct contact with the gate spacer; and
- the second bottom surface is in direct contact with the metal-containing gate electrode.

14. The semiconductor device of claim 13, further comprising:
- an interlayer dielectric (ILD) disposed over the first source/drain region or over the second source/drain region; and
- a dielectric layer disposed over the metal-containing gate electrode;

wherein
- the high-k dielectric component is disposed between the ILD and the dielectric layer;
- the ILD is in direct contact with the first side surface of the high-k dielectric component; and
- the dielectric layer is in direct contact with the second side surface of the high-k dielectric component.

15. The semiconductor device of claim 14, wherein the high-k dielectric component has a greater dielectric constant than the dielectric layer.

16. The semiconductor device of claim 13, wherein an upper surface of the gate spacer is more elevated vertically than the second bottom surface of the high-k dielectric component.

17. The semiconductor device of claim 13, wherein the second bottom surface of the high-k dielectric component is more curved than the first bottom surface of the high-k dielectric component.

18. A semiconductor device, comprising:
- a first source/drain region and a second source/drain region;
- a fin structure located between the first source/drain region and the second source/drain region in a cross-sectional side view;
- a gate dielectric located over the fin structure in the cross-sectional side view;
- a metal-containing gate electrode located over the gate dielectric in the cross-sectional side view;
- an interlayer dielectric (ILD) located over the first source/drain region and over the second source/drain region in the cross-sectional side view;
- a dielectric component located over the metal-containing gate electrode in the cross-sectional side view; and
- a gate helmet located over and protrudes downwardly into the metal-containing gate electrode and between the ILD and the dielectric component in the cross-sectional side view, wherein the gate helmet has a greater dielectric constant than the dielectric component and the ILD, and wherein a shape of the gate helmet in the cross-sectional side view resembles a vertically flipped letter "L".

19. The semiconductor device of claim 18, further comprising gate spacers located between the ILD and the metal-containing gate electrode in the cross-sectional side view, wherein the gate spacers are in direct contact with a portion of a bottom surface of the gate helmet and with a portion of a side surface of the gate helmet.

20. The semiconductor device of claim 18, wherein:
- a bottommost surface of the gate helmet is more curved than a bottommost surface of the dielectric component; and
- the bottommost surface of the gate helmet is more elevated vertically than a bottom surface of the ILD.

* * * * *